(12) United States Patent
Molina et al.

(10) Patent No.: US 11,942,387 B2
(45) Date of Patent: Mar. 26, 2024

(54) PLATED WALLS DEFINING MOLD COMPOUND CAVITIES

(71) Applicant: TEXAS INSTRUMENTS INCORPORATED, Dallas, TX (US)

(72) Inventors: John Carlo Cruz Molina, Limay (PH); Julian Carlo Concepcion Barbadillo, Mabalacat (PH); Ray Fredric Solis De Asis, Mabalacat (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 93 days.

(21) Appl. No.: 17/491,354

(22) Filed: Sep. 30, 2021

(65) Prior Publication Data
US 2023/0095185 A1  Mar. 30, 2023

(51) Int. Cl.
| | |
|---|---|
| H01L 23/31 | (2006.01) |
| H01L 21/56 | (2006.01) |
| H01L 23/00 | (2006.01) |
| H01L 25/00 | (2006.01) |
| H01L 25/10 | (2006.01) |

(52) U.S. Cl.
CPC .......... *H01L 23/315* (2013.01); *H01L 21/565* (2013.01); *H01L 23/3114* (2013.01); *H01L 24/16* (2013.01); *H01L 25/10* (2013.01); *H01L 25/50* (2013.01); *H01L 2224/16145* (2013.01)

(58) Field of Classification Search
None
See application file for complete search history.

(56) References Cited

FOREIGN PATENT DOCUMENTS

| | | | |
|---|---|---|---|
| CN | 107478689 | * | 10/2016 |
| JP | 200898685 | * | 4/2008 |

* cited by examiner

*Primary Examiner* — Long Pham
(74) *Attorney, Agent, or Firm* — Dawn Jos; Frank D. Cimino

(57) ABSTRACT

In examples, a semiconductor package comprises a wafer chip scale package (WCSP) having circuitry formed in a device side and an insulative layer above the device side. The WCSP includes one or more plated walls extending vertically to form a defined space, the one or more plated walls configured to prevent mold compound from flowing into the defined space. The WCSP includes mold compound abutting surfaces of the one or more plated walls opposing the defined space. The WCSP includes a conductive terminal coupled to the circuitry and extending from the WCSP into the defined space.

15 Claims, 25 Drawing Sheets

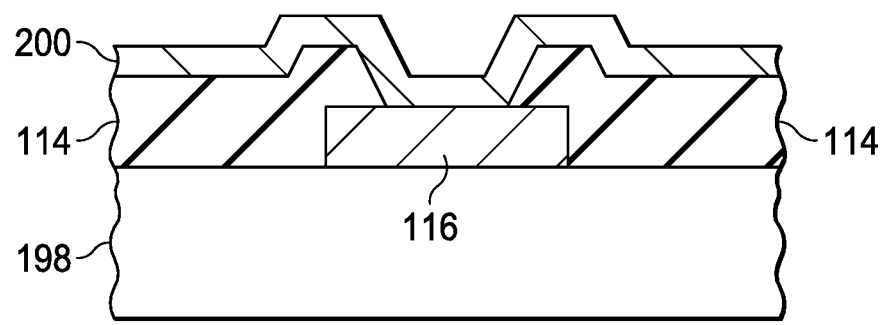
FIG. 2A1
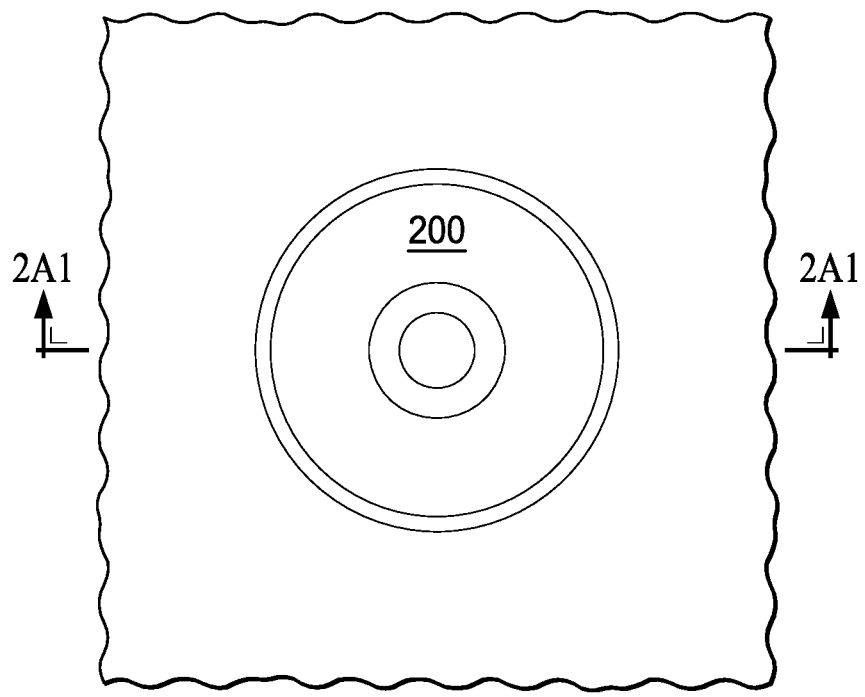
FIG. 2A2

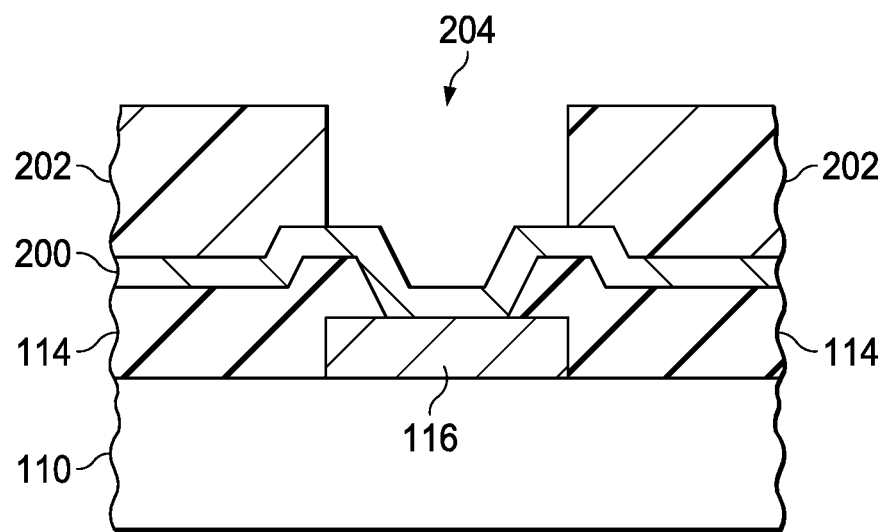
FIG. 2B1
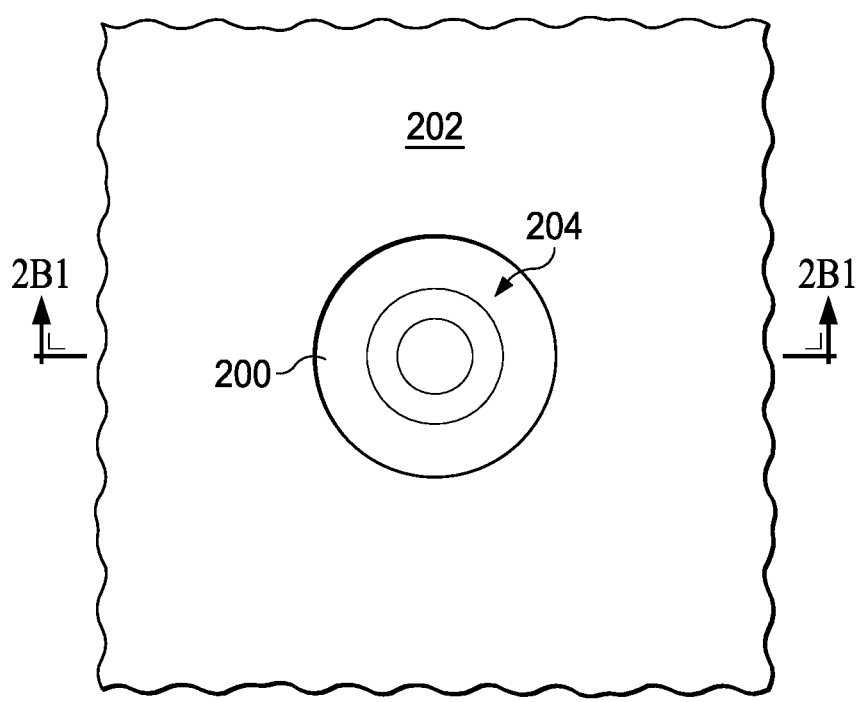
FIG. 2B2

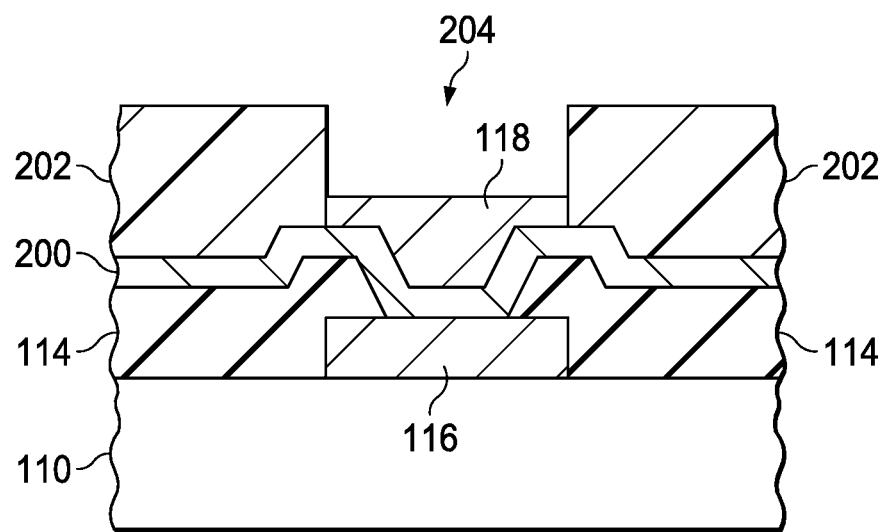
FIG. 2C1
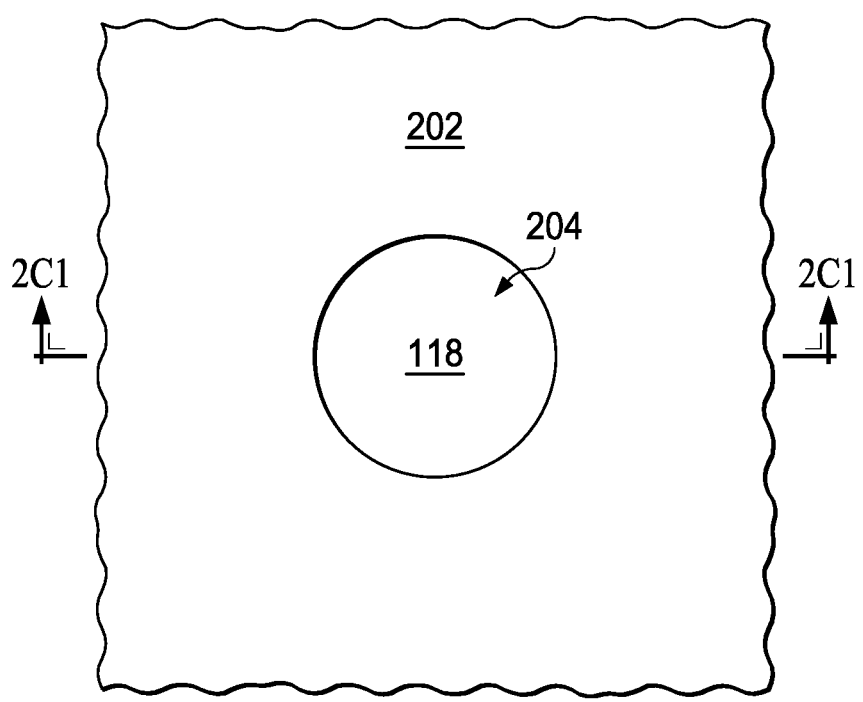
FIG. 2C2

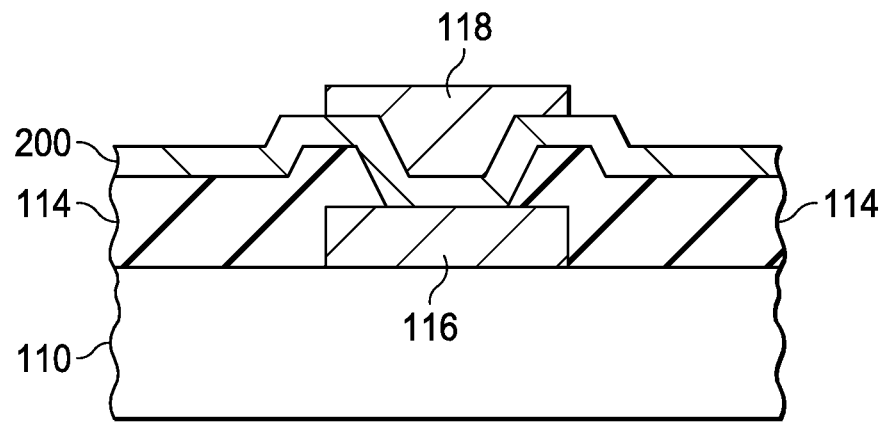
FIG. 2D1
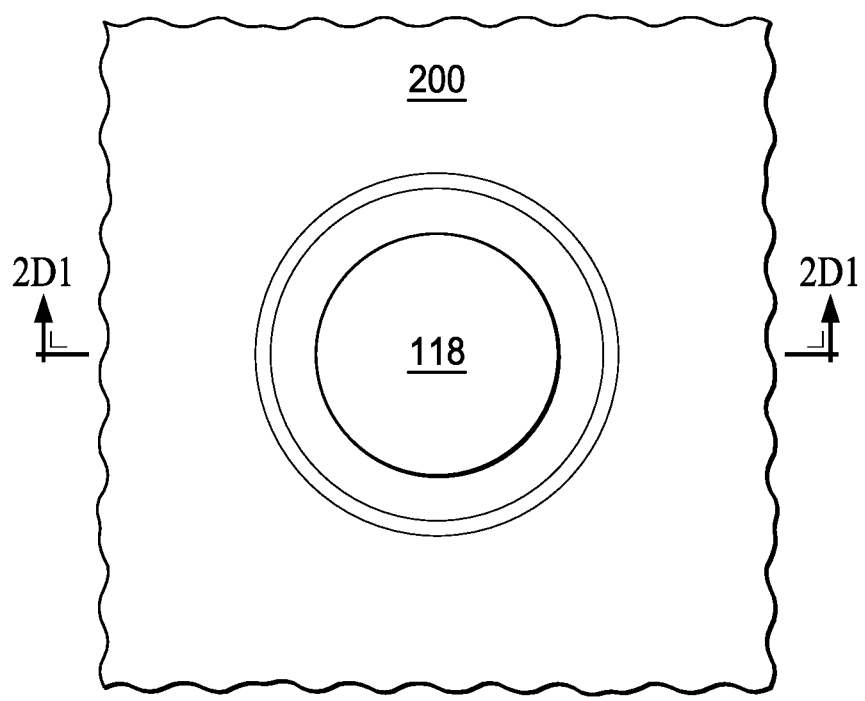
FIG. 2D2

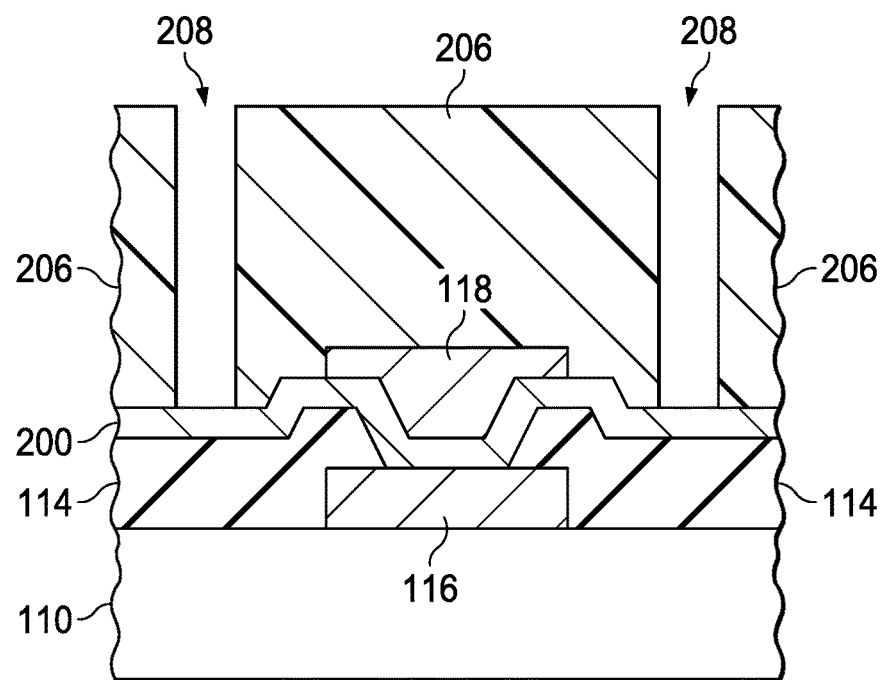
FIG. 2E1
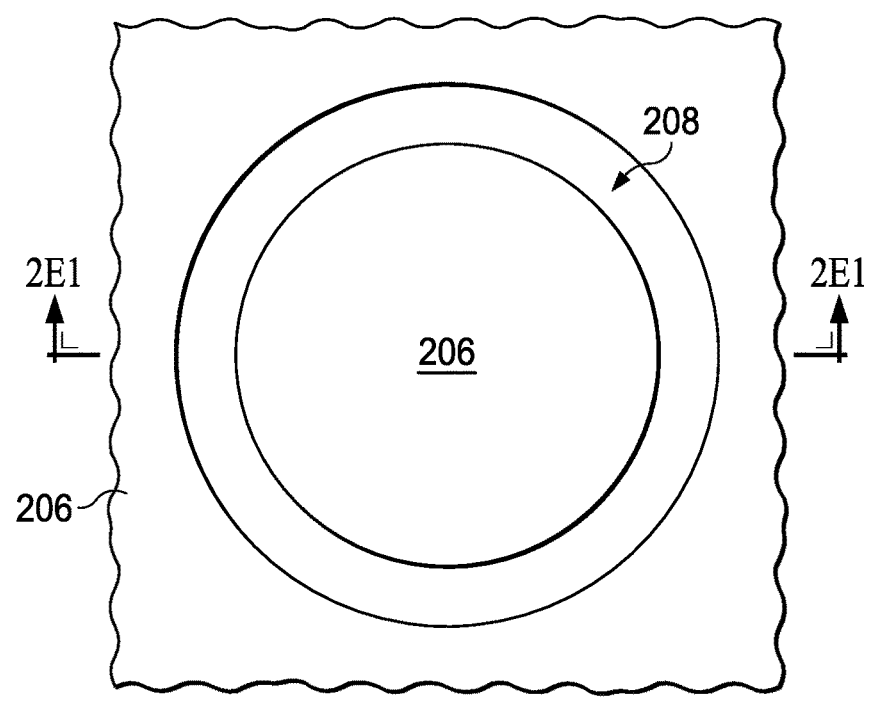
FIG. 2E2

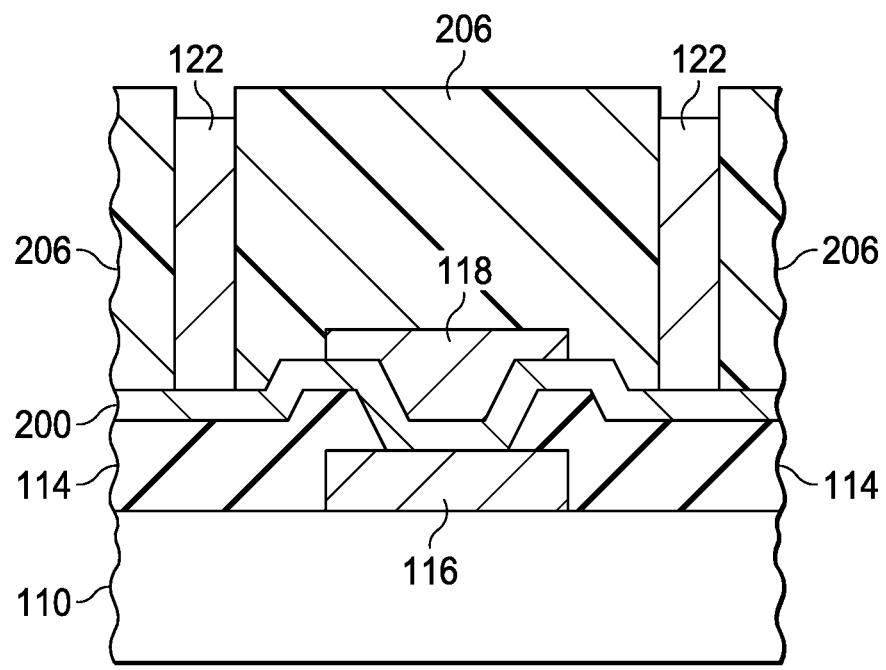
FIG. 2F1
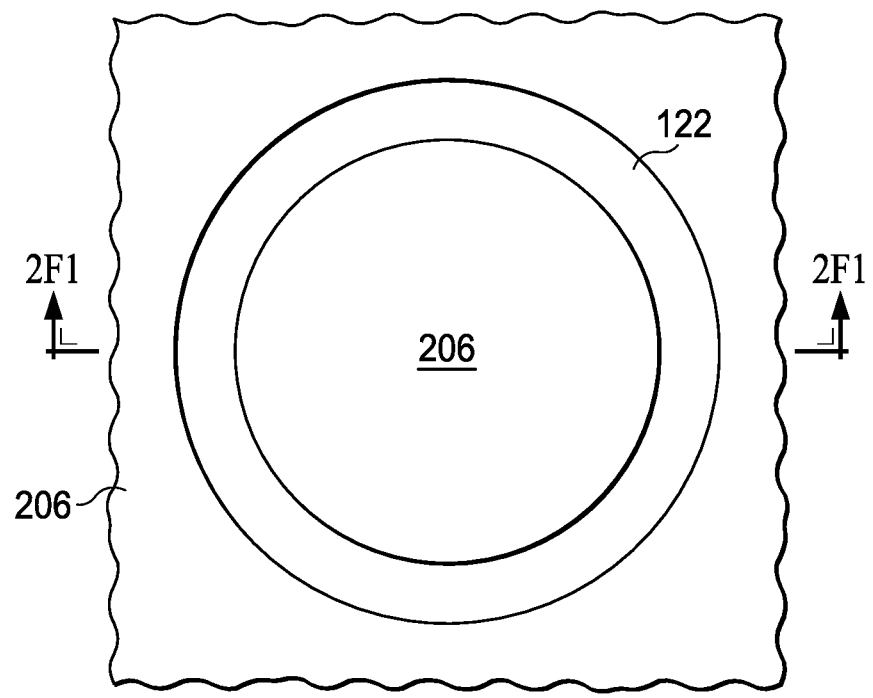
FIG. 2F2

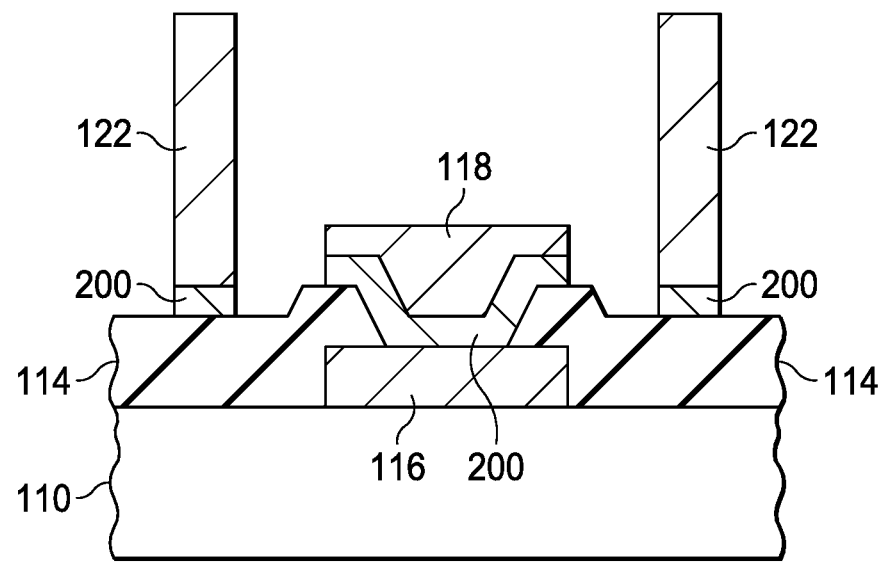
FIG. 2G1
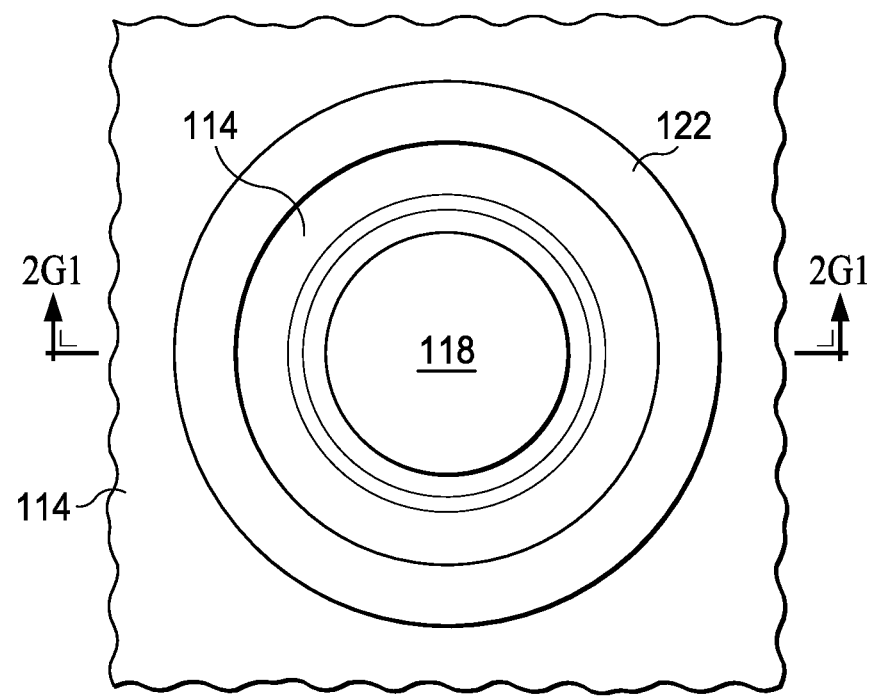
FIG. 2G2

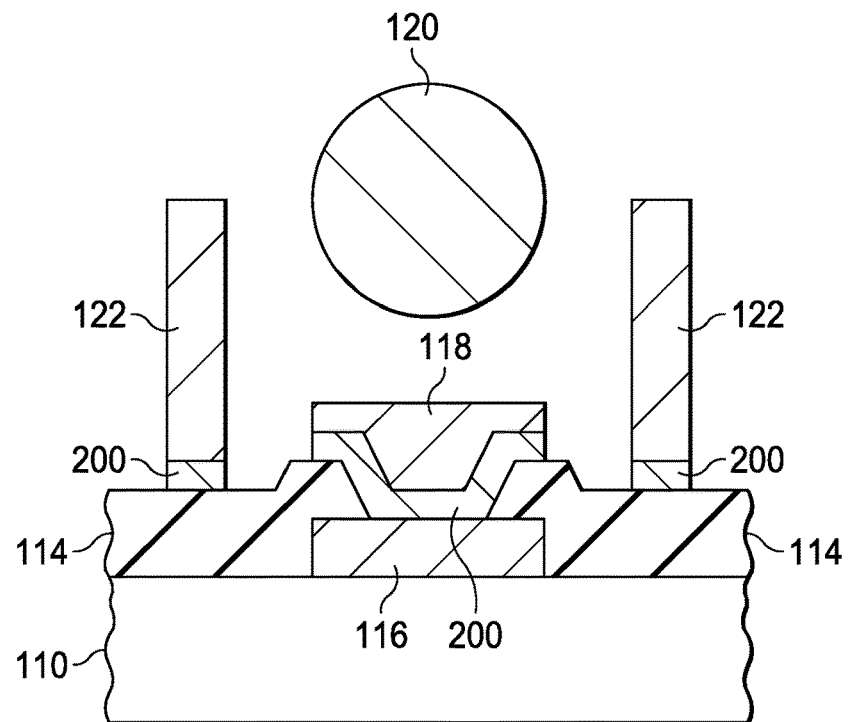
FIG. 2H1
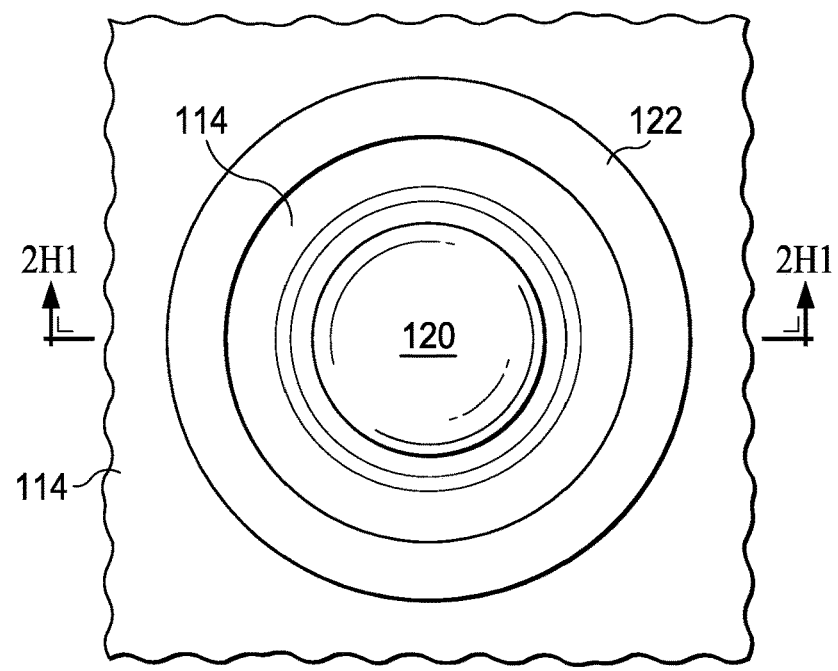
FIG. 2H2

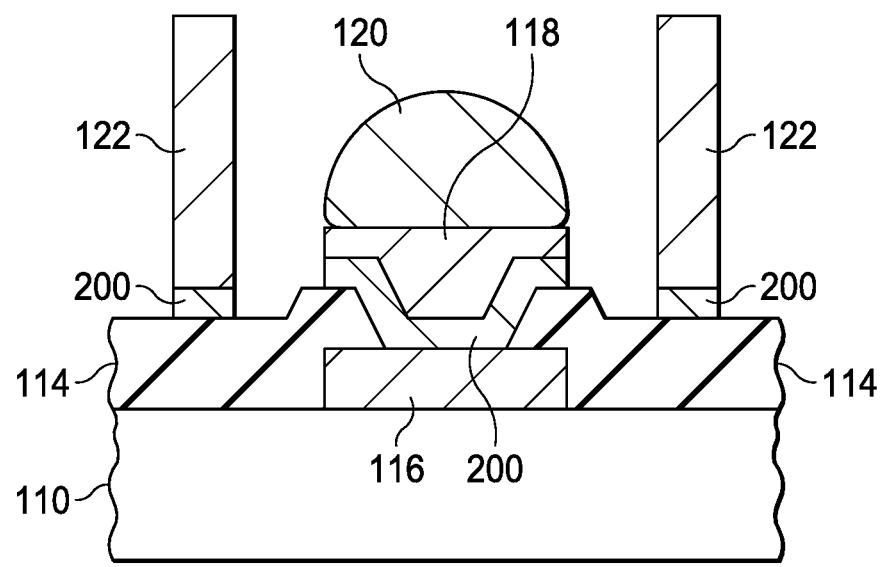
FIG. 2I1
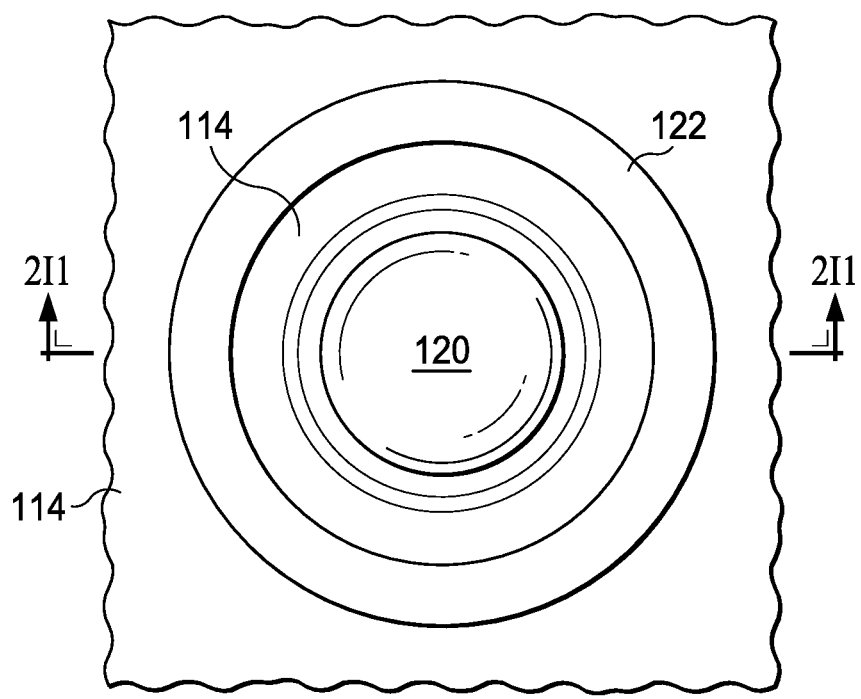
FIG. 2I2

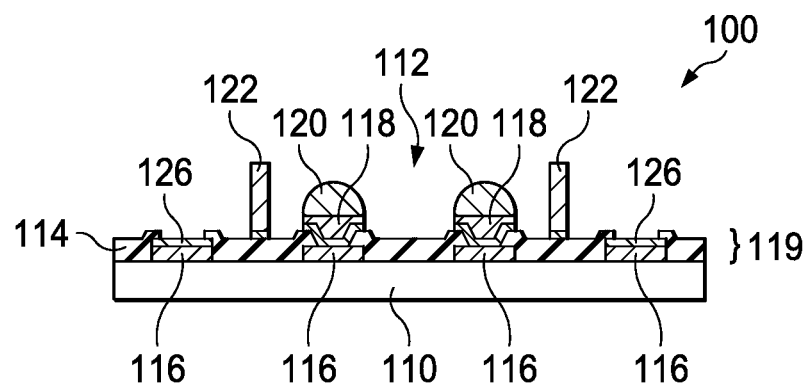
FIG. 3A1
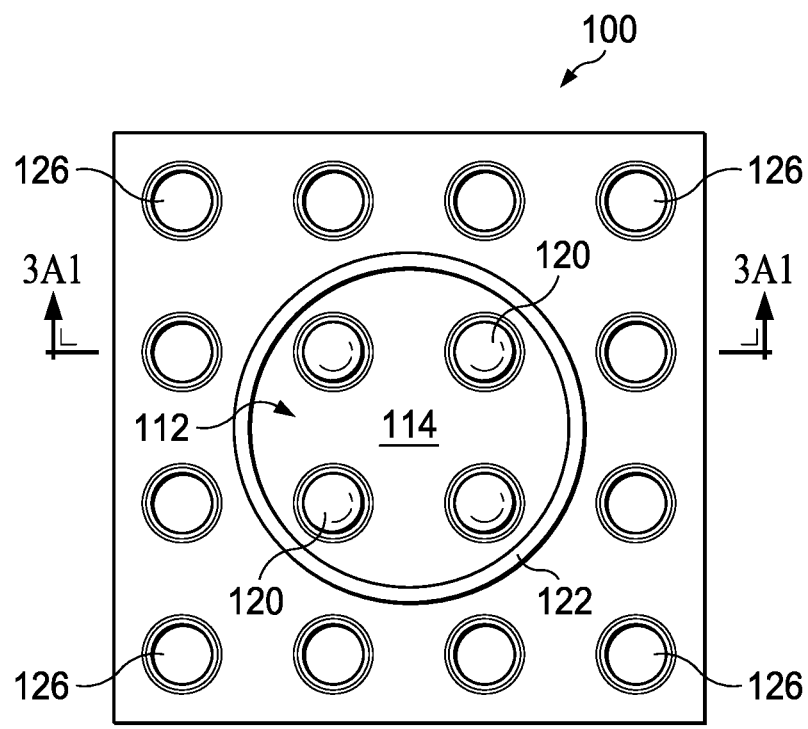
FIG. 3A2

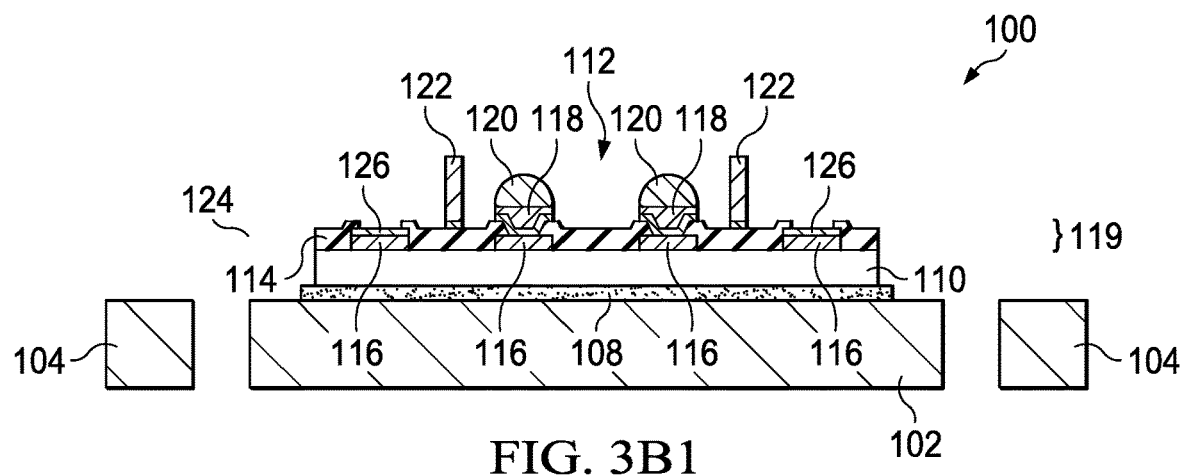
FIG. 3B1
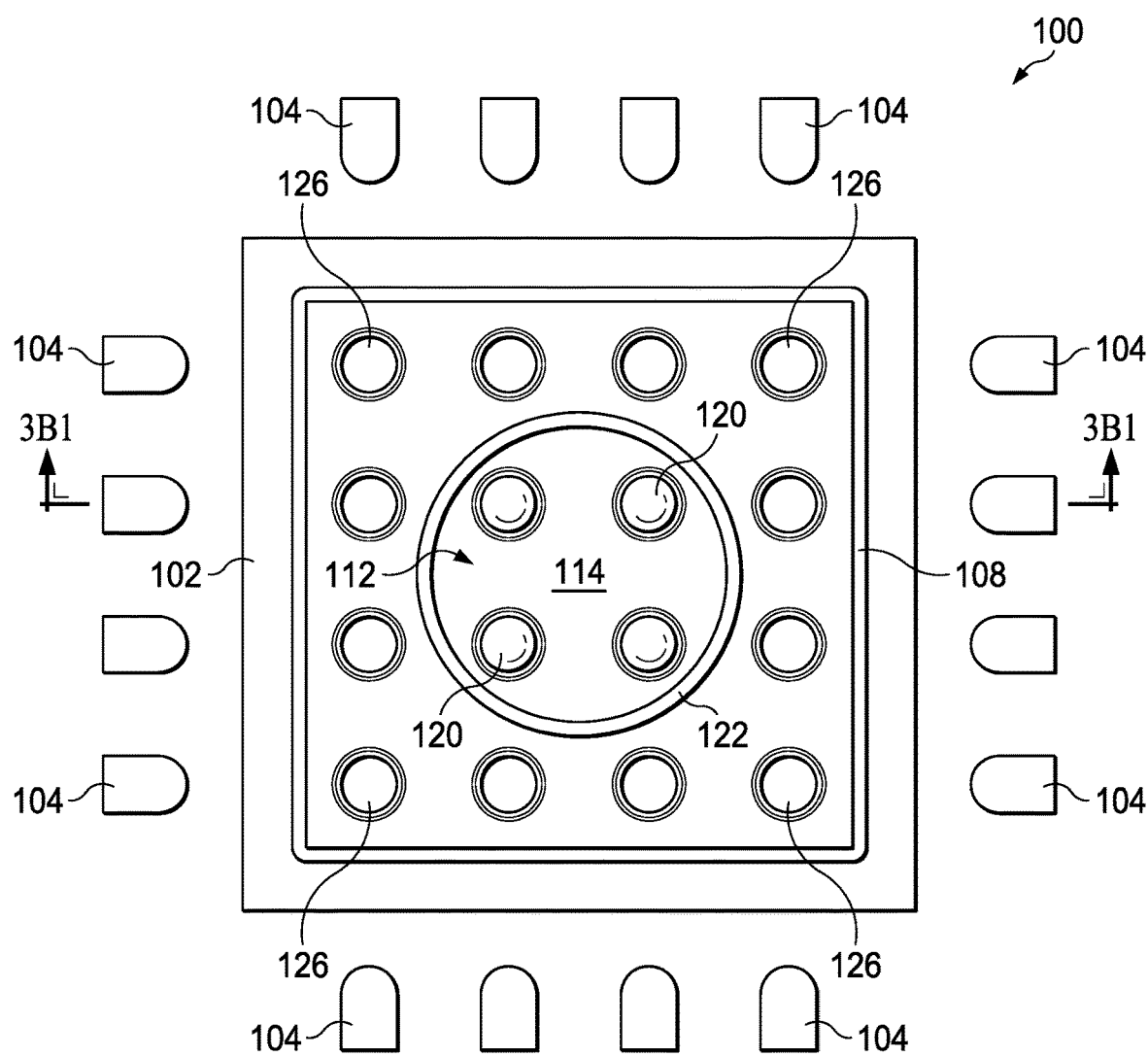
FIG. 3B2

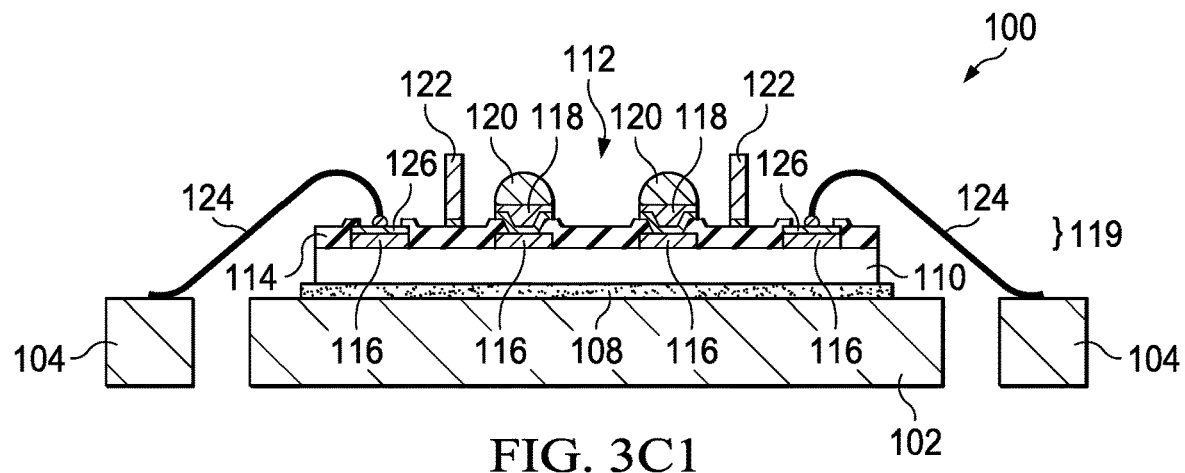
FIG. 3C1
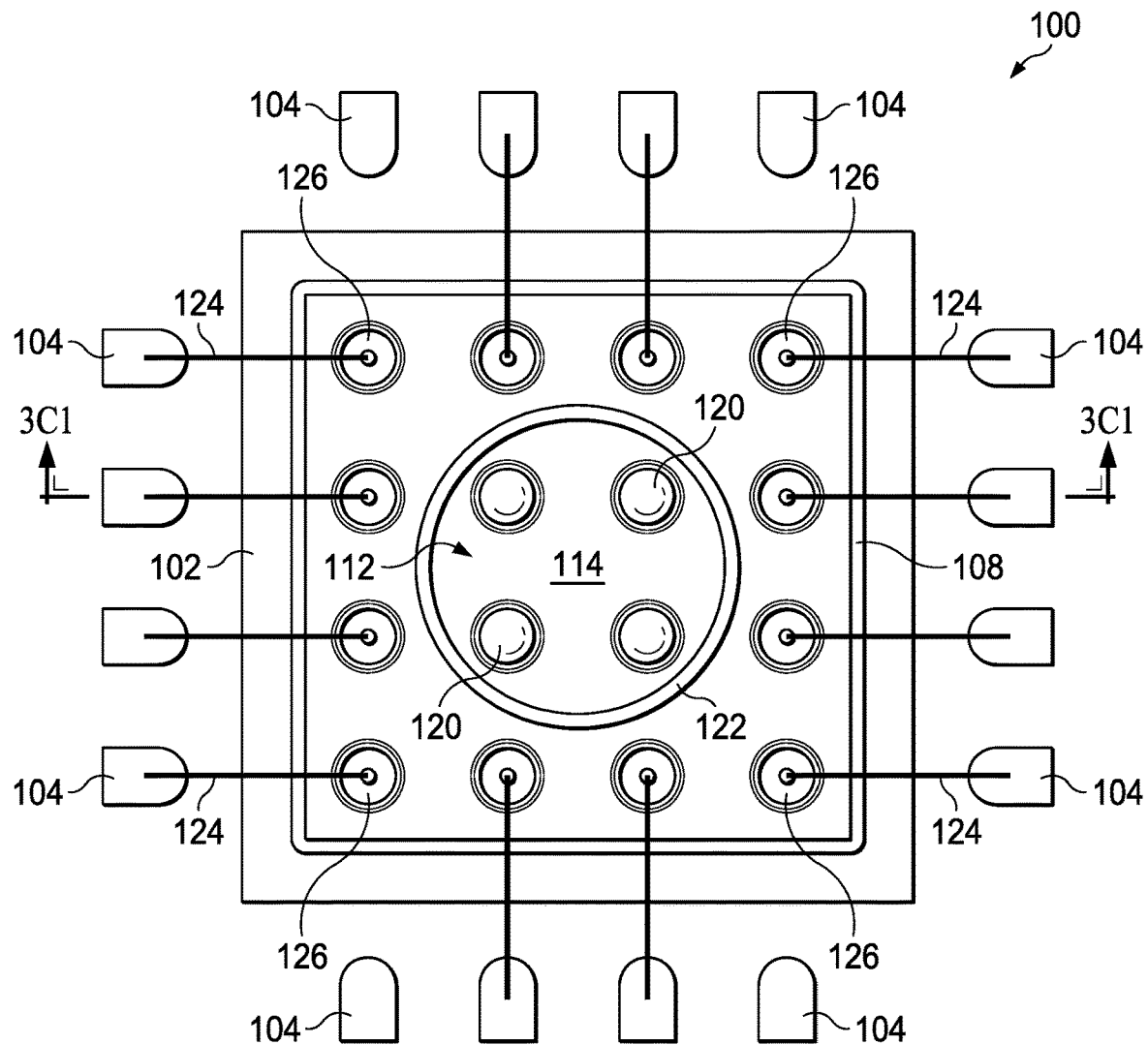
FIG. 3C2

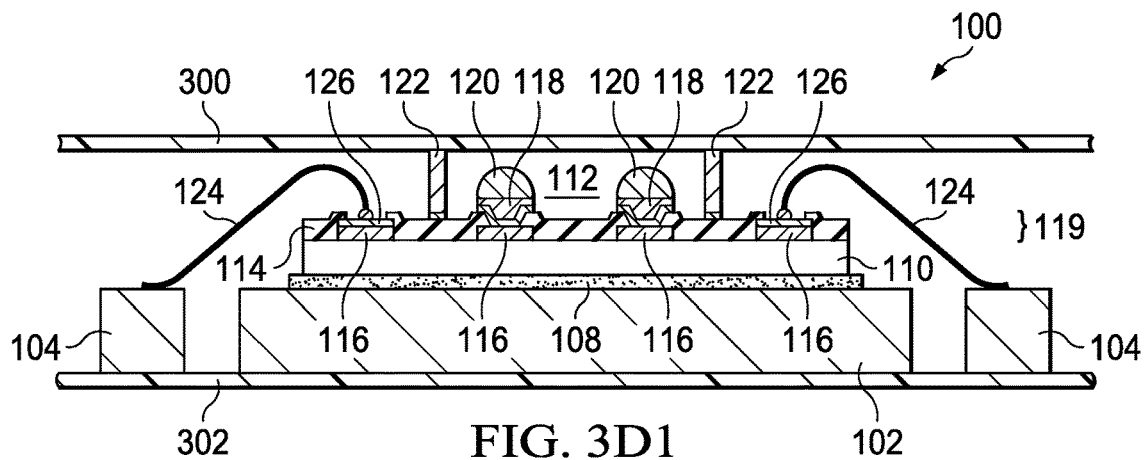
FIG. 3D1
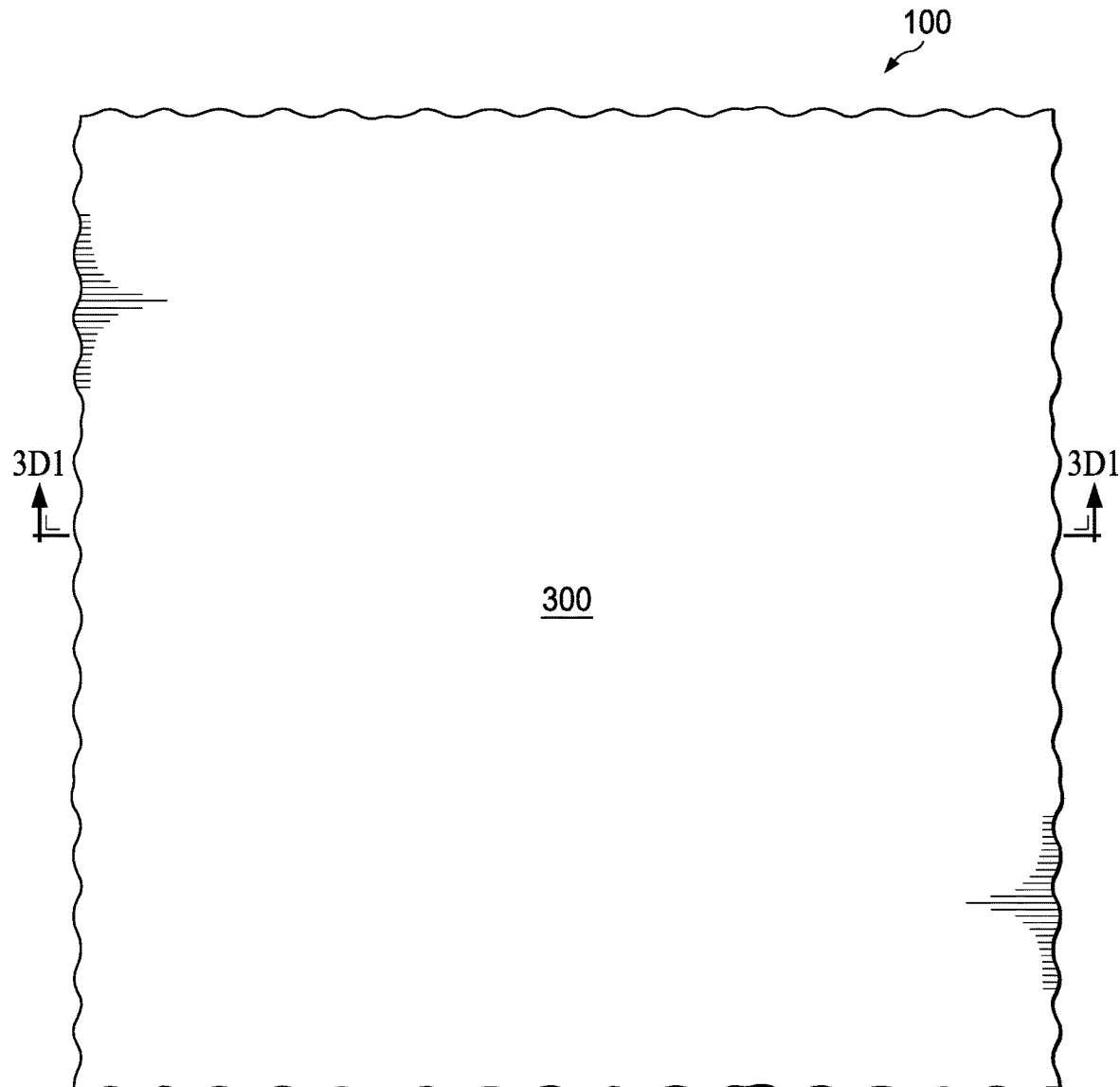
FIG. 3D2

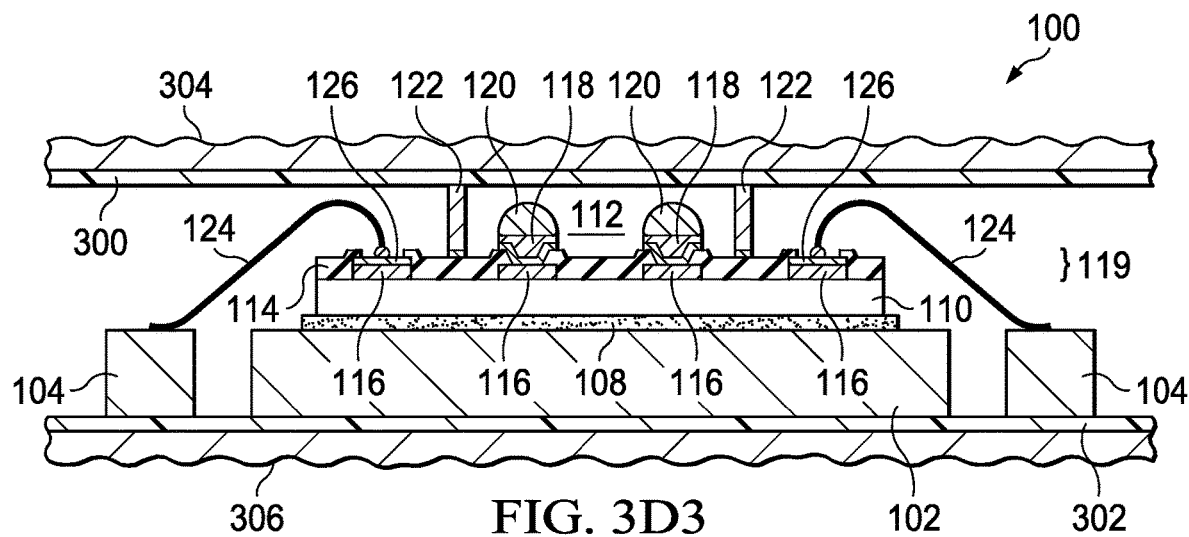
FIG. 3D3
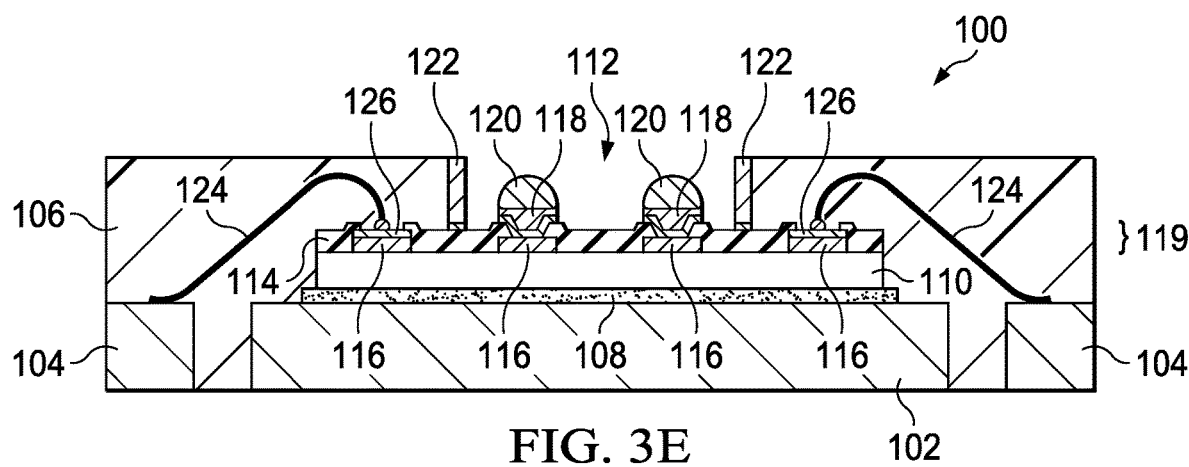
FIG. 3E

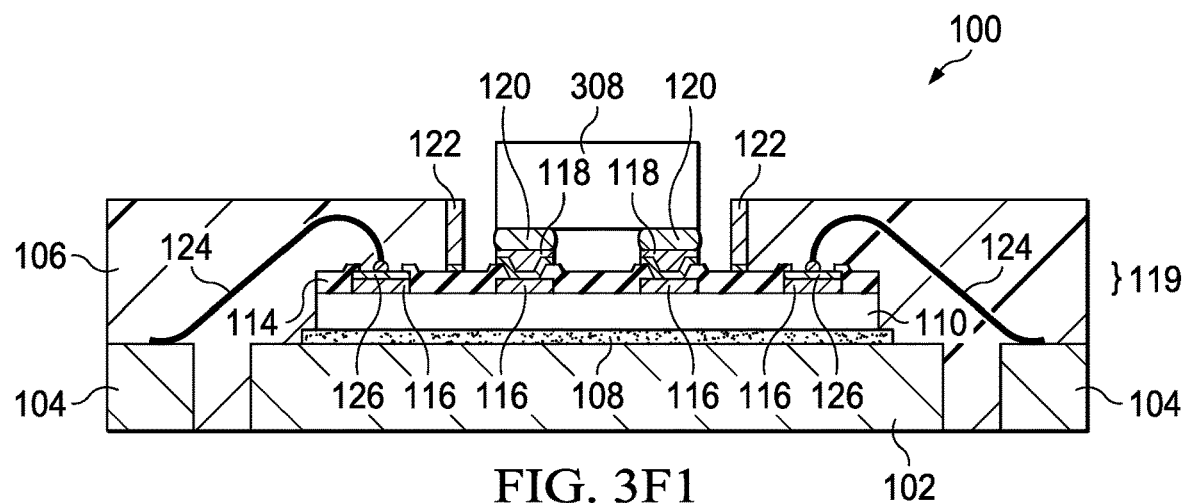
FIG. 3F1
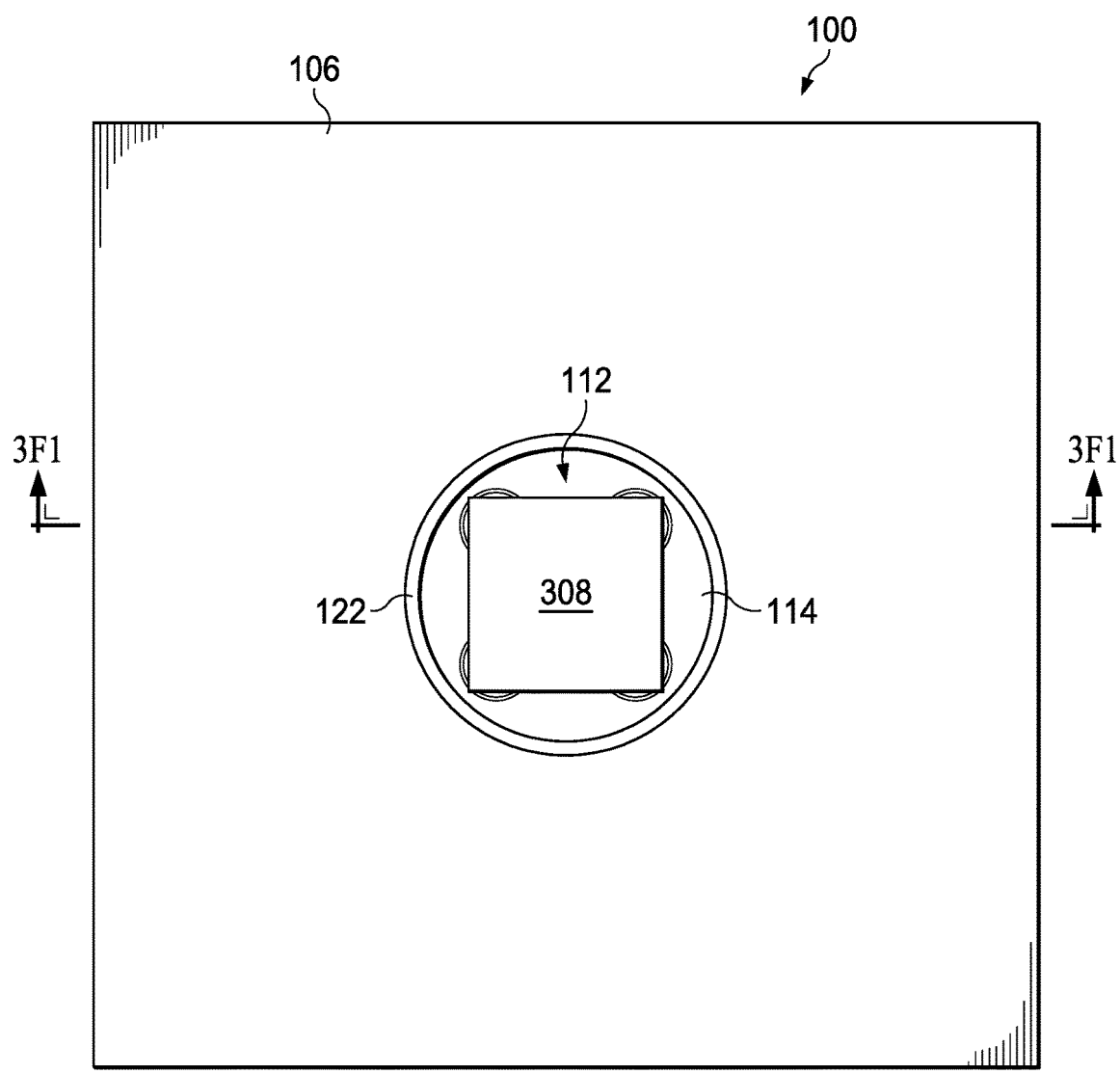
FIG. 3F2

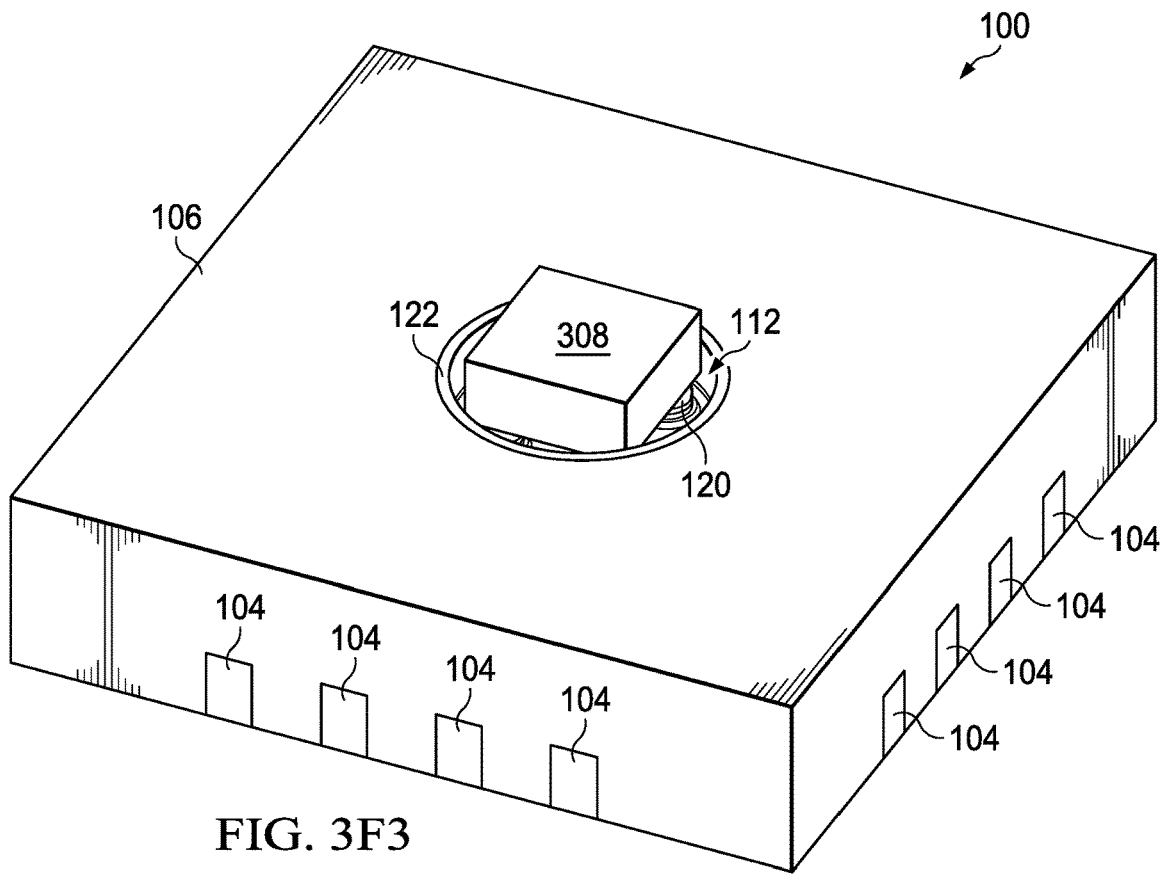
FIG. 3F3
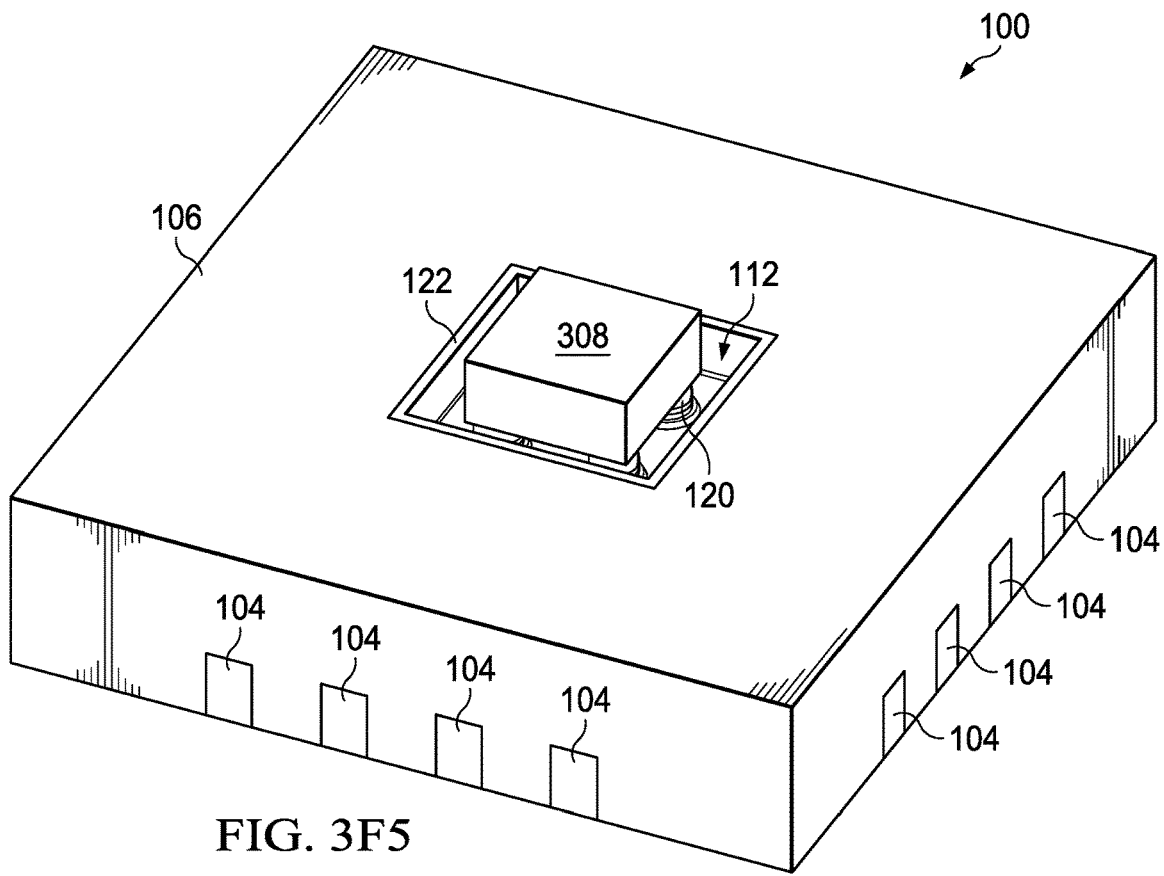
FIG. 3F5

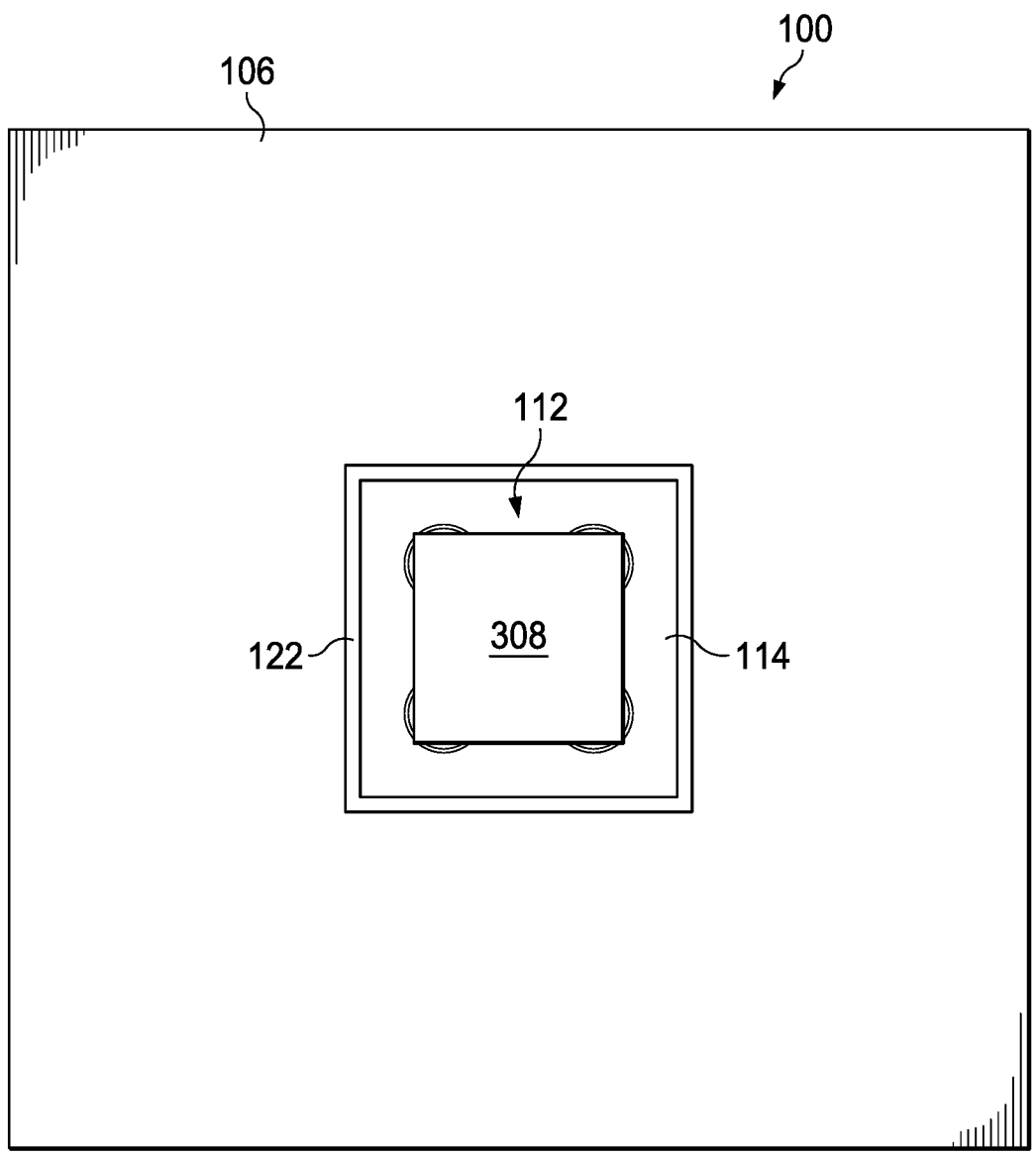
FIG. 3F4

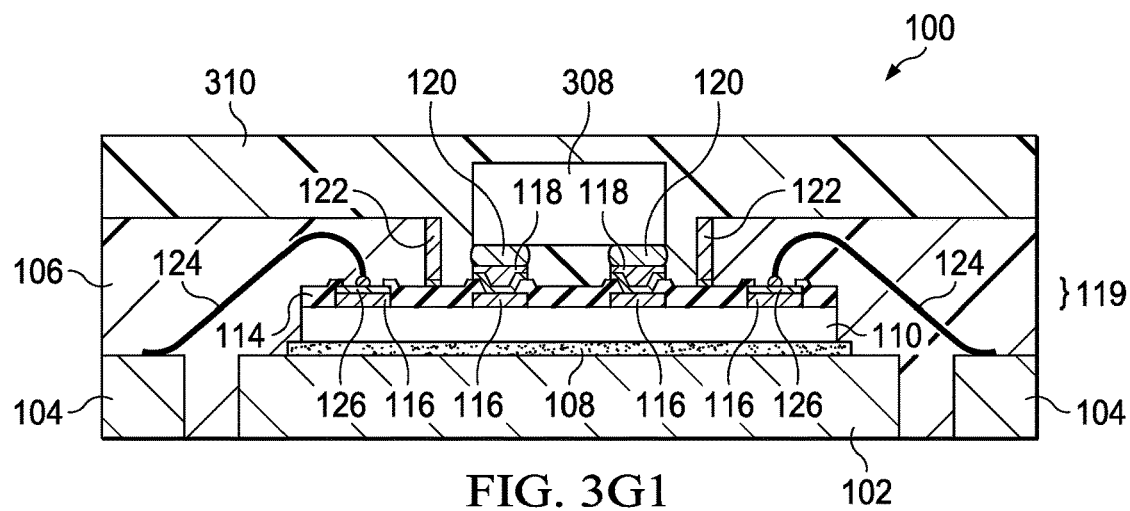
FIG. 3G1
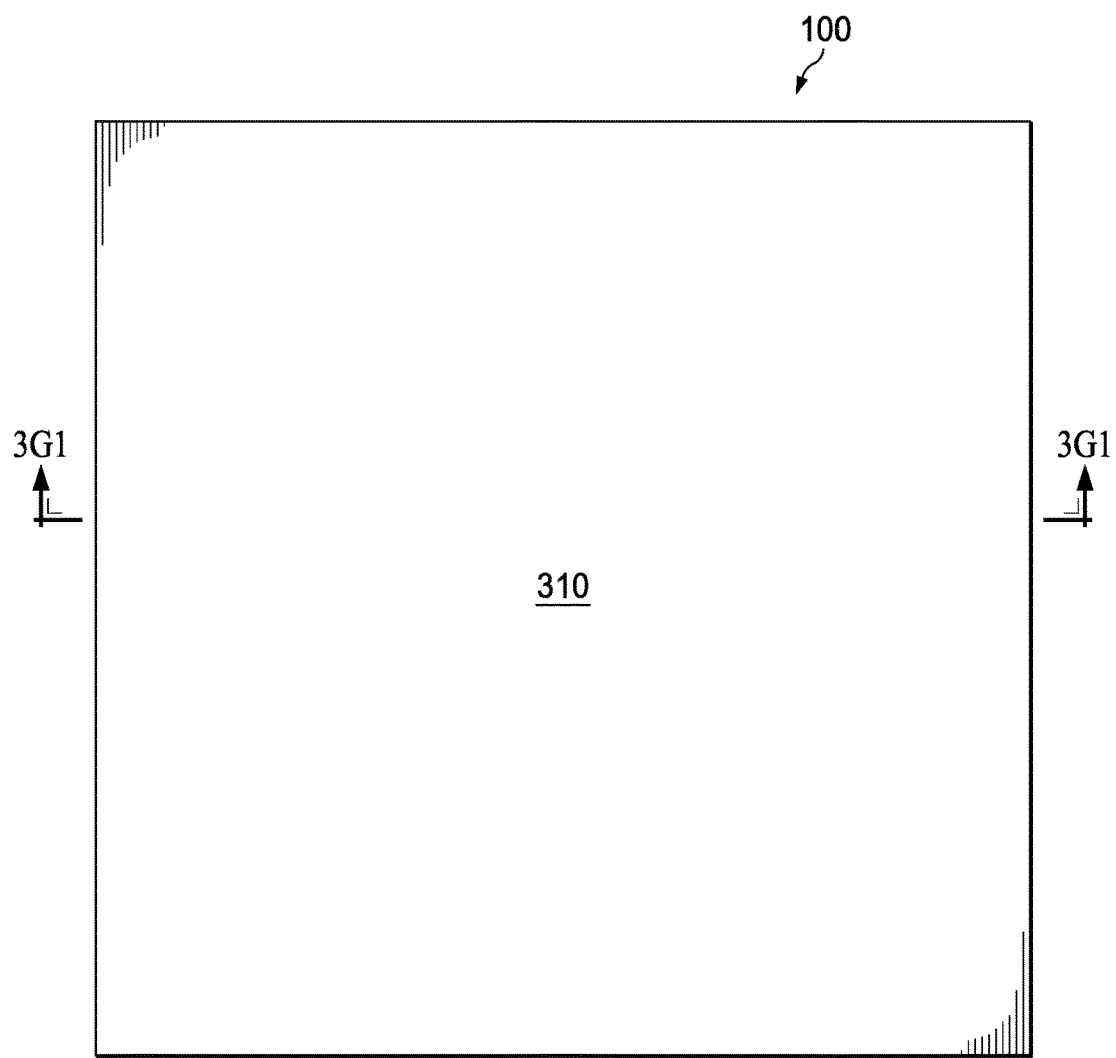
FIG. 3G2

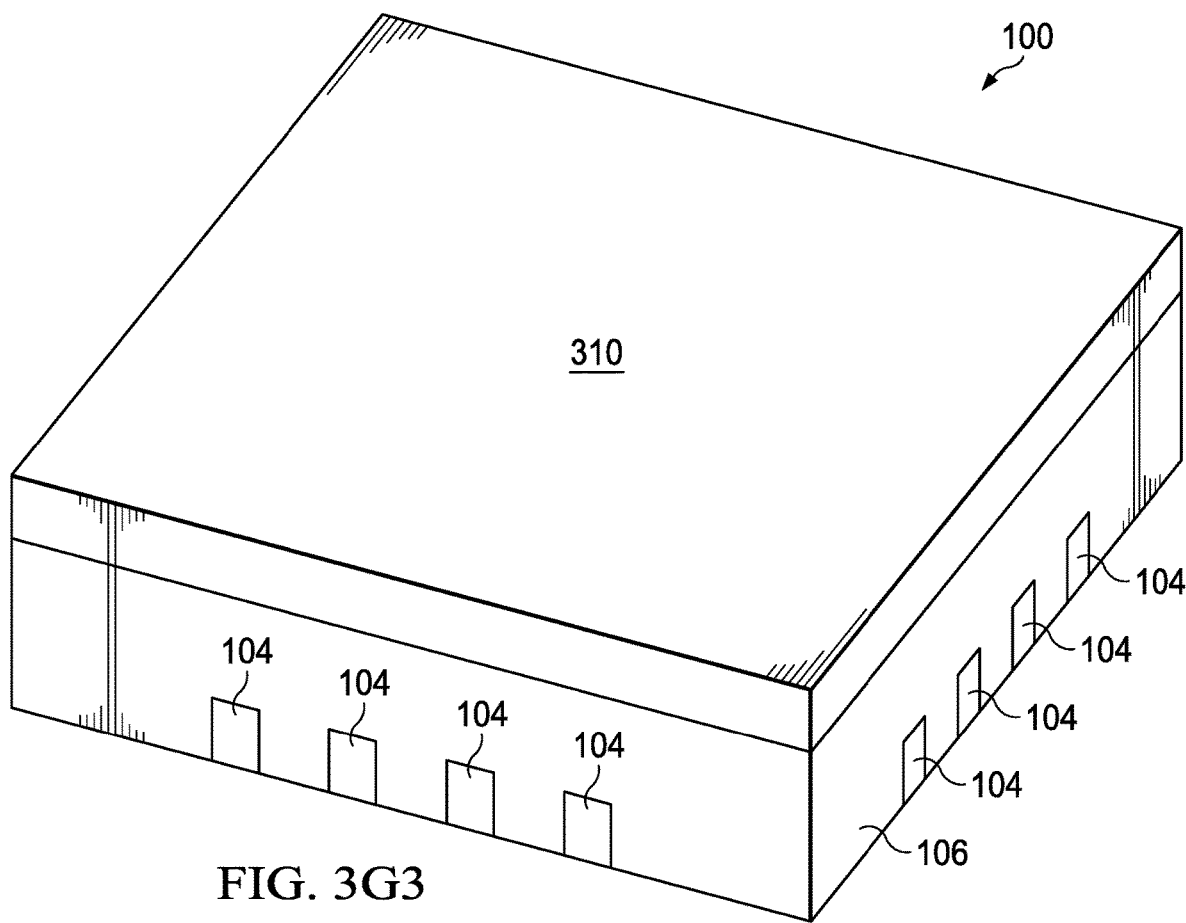
FIG. 3G3
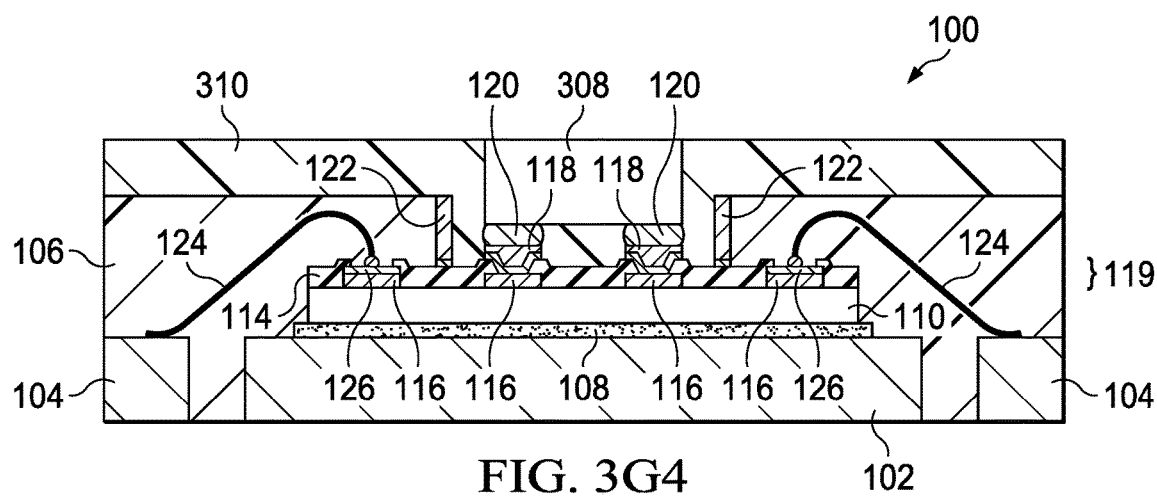
FIG. 3G4

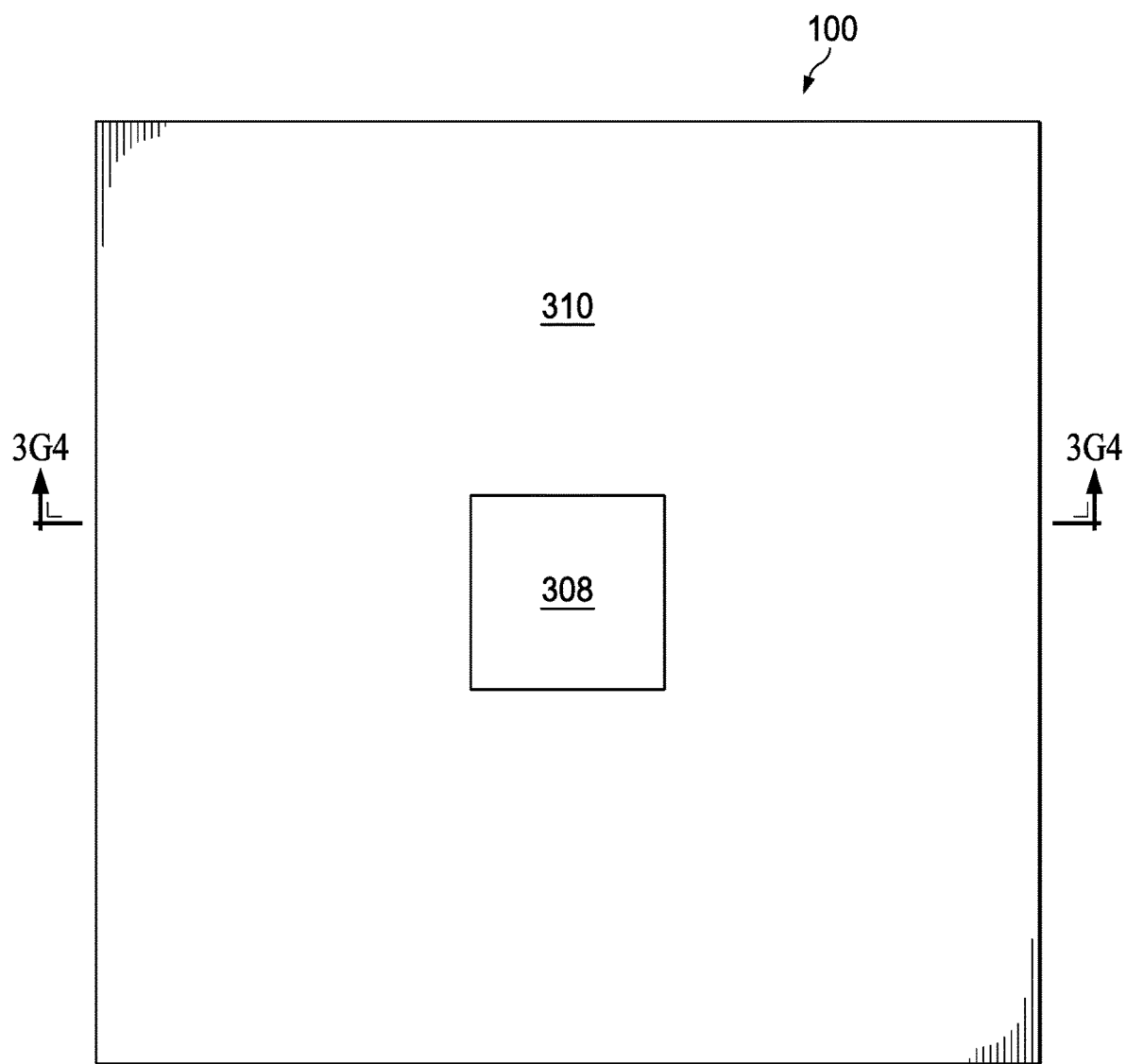
FIG. 3G5

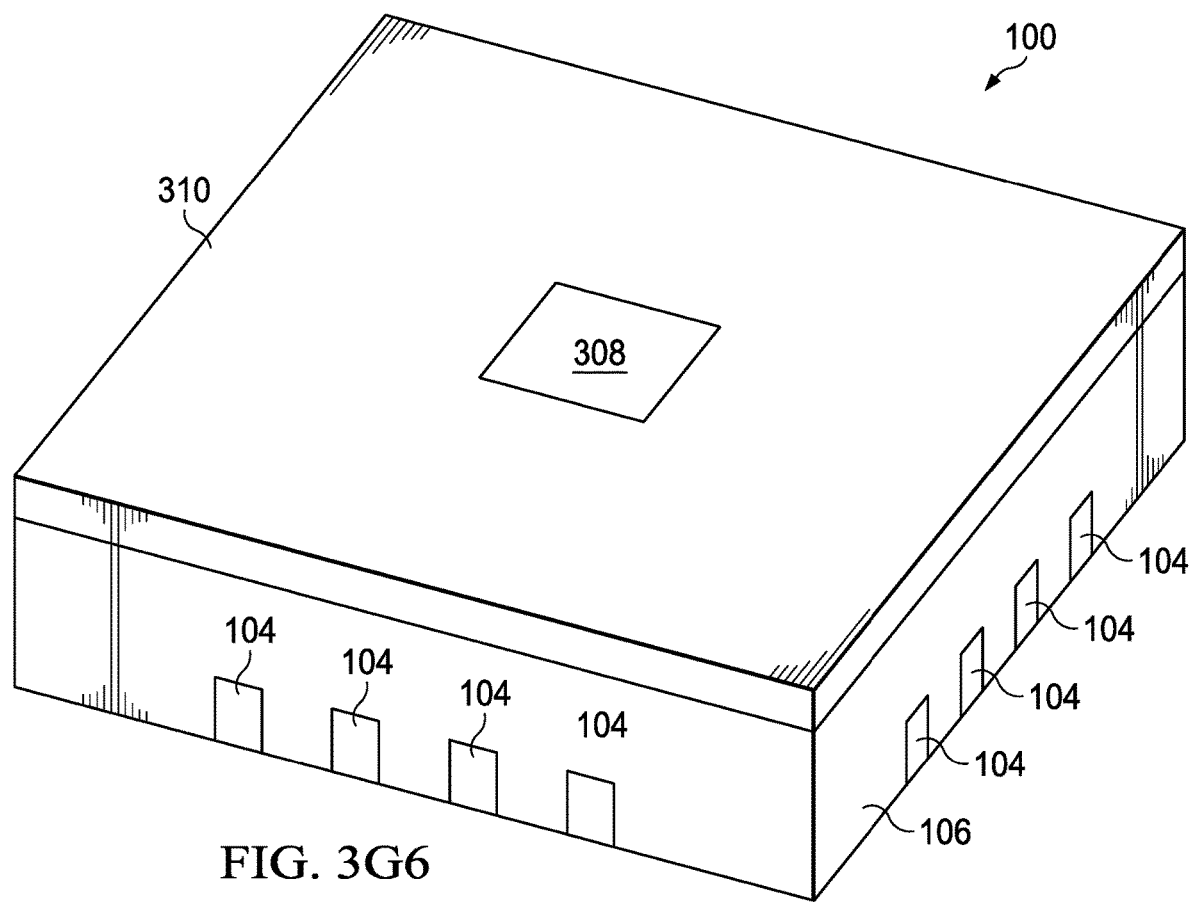
FIG. 3G6

PLATED WALLS DEFINING MOLD COMPOUND CAVITIES

BACKGROUND

Semiconductor chips are often housed inside semiconductor packages that protect the chips from deleterious environmental influences, such as heat, moisture, and debris, using a mold compound. A packaged chip communicates with electronic devices outside the package via conductive terminals, such as leads, that are exposed to surfaces of the package. Within the package, the chip may be electrically coupled to the conductive terminals using any suitable technique. One such technique is the flip-chip technique, in which the semiconductor chip (also called a "die") is flipped so the device side of the chip (in which circuitry is formed) is facing downward. The device side is coupled to the conductive terminals using, e.g., solder bumps. Another technique is the wirebonding technique, in which the device side of the semiconductor chip is oriented upward and is coupled to the conductive terminals using bond wires.

SUMMARY

In examples, a semiconductor package comprises a wafer chip scale package (WCSP) having circuitry formed in a device side and an insulative layer above the device side. The WCSP includes one or more plated walls extending vertically to form a defined space, the one or more plated walls configured to prevent mold compound from flowing into the defined space. The WCSP includes mold compound abutting surfaces of the one or more plated walls opposing the defined space. The WCSP includes a conductive terminal coupled to the circuitry and extending from the WCSP into the defined space.

In examples, a method comprises performing a first photolithographic process to form a conductive terminal coupled to a device side of a semiconductor die. The method includes performing a second photolithographic process to electroplate one or more walls circumscribing the conductive terminal. The method includes applying a film to a top surface of the one or more walls. The method includes positioning the semiconductor die, the conductive terminal, and the one or more electroplated walls within a mold chase. The method includes injecting mold compound into the mold chase to cause the mold compound to cover portions of the semiconductor die, the film and the one or more electroplated walls preventing the mold compound from covering the conductive terminal.

BRIEF DESCRIPTION OF THE DRAWINGS

For a detailed description of various examples, reference will now be made to the accompanying drawings in which:

FIGS. 2A1-2I2 are profile cross-sectional and top-down views of a process flow for fabricating a semiconductor package having plated walls, in accordance with various examples.

FIGS. 3A1-3G6 are profile cross-sectional, top-down, and perspective views of a process flow for fabricating a semiconductor package having plated walls defining a mold compound cavity, in accordance with various examples.

DETAILED DESCRIPTION

In some types of semiconductor packages, a cavity may be formed within the mold compound, such as in a top surface of the mold compound, to enable other circuit components (e.g., other packages, passive components) to be positioned in the cavity and to couple to the semiconductor die within the package via the cavity. For example, another package or a passive component, such as a capacitor, may be positioned inside the cavity and may couple to the semiconductor die in the package through conductive terminals extending through the cavity floor. The incorporation of such components into semiconductor package cavities facilitates the efficient use of space. Typically, such cavities are formed using a subtractive process, such as a laser ablation process that is used to selectively remove the mold compound. However, such subtractive processes introduce high levels of heat to the mold compound, and, as the depth of the cavity increases and approaches the semiconductor die and conductive terminals (e.g., solder or copper pads) on the die, the heat from the subtractive process damages the die and/or the conductive terminals. Such thermal damage diminishes the operational integrity, mechanical integrity, and lifespan of the package.

This disclosure describes various examples of a semiconductor package having a mold compound cavity formed using a non-subtractive process, thereby mitigating the thermal damage concerns associated with subtractive processes as described above. More specifically, the semiconductor package includes a mold compound having a cavity defined by one or more vertical, plated walls that preclude mold compound from flowing into the cavity during a mold compound injection process. Accordingly, the mold compound cavity is considered to be a space in the mold compound that is defined at least in part by the plated walls. One or more components (e.g., another semiconductor package, a passive component) may be positioned inside the cavity and coupled to conductive terminals that are accessible from within the cavity, such as through the cavity floor. In this manner, a mold compound cavity is formed without using a subtractive process, thereby mitigating thermal damage to the semiconductor package and the negative consequences associated with such thermal damage.

Figure 1A:
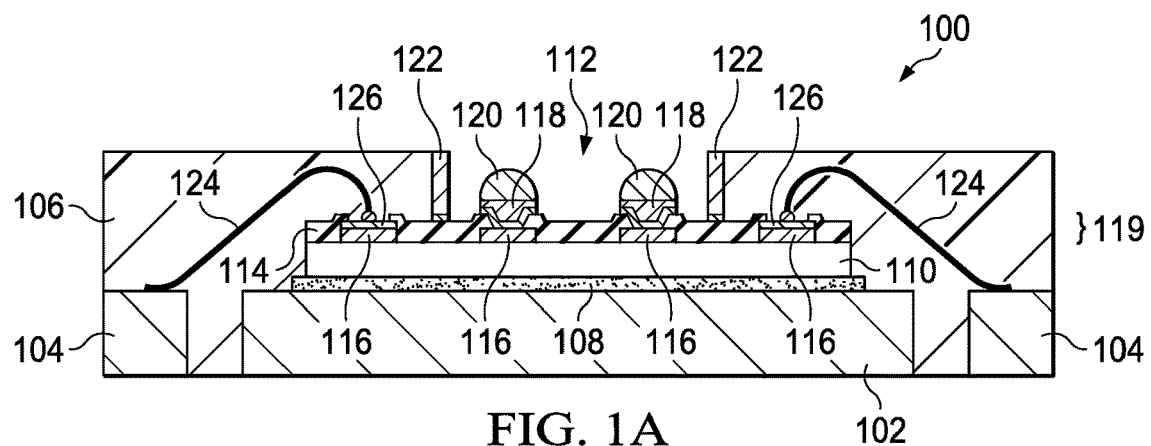
FIG. 1A is a profile cross-sectional view of a semiconductor package having plated walls defining a mold compound cavity, in accordance with various examples.

FIG. 1A is a profile cross-sectional view of a semiconductor package 100 having plated walls defining a mold compound cavity, in accordance with various examples. The package 100 may be a quad flat no lead (QFN) style package, a dual inline package (DIP) having gullwing-style leads, or any of a variety of other styles of packages. The package 100 includes a die pad 102 and conductive terminals 104, each of which are exposed to a bottom surface of a mold compound 106. In addition to being exposed to the bottom surface of the mold compound 106, the conductive terminals 104 also may be exposed to side surfaces of the mold compound 106, for example, to facilitate solder wetting. A top surface of the die pad 102 abuts a die attach layer 108, and a semiconductor die 110 abuts the die attach layer 108. The die attach layer 108 thus couples the semiconductor die 110 to the die pad 102. The semiconductor die 110 has a device side in which circuitry is formed and a non-device side that lacks circuitry. In examples, the device side of the semiconductor die 110 faces upward, away from the die attach layer 108. By orienting the device side of the semiconductor die 110 upward in this manner, the circuitry formed in the device side of the semiconductor die 110 is accessible through a mold compound cavity (also referred to herein as a defined space) 112, as described in further detail below.

In examples, the semiconductor package 100 further includes an insulative layer (e.g., polyimide layer) 114 that abuts the device side of the semiconductor die 110. The insulative layer 114 appropriately insulates and protects from corrosion the circuitry in the device side of the semiconductor die 110 and conductive terminals 116. Conductive terminals 116, which may be formed of copper or any other suitable plating metal, are coupled to appropriate areas of circuitry on the device side of the semiconductor die 110 to form appropriate, application-specific communicative pathways. Conductive terminals 118 are coupled to conductive terminals 116 and abut the insulative layer 114. For example, conductive terminals 118 are partly or entirely horizontally co-planar with the insulative layer 114. In some examples, portions of conductive terminals 118 extend above the horizontal plane of the insulative layer 114. The conductive terminals 118 are exposed to the mold compound cavity 112. Solder members 120 are coupled to the conductive terminals 118. Together, the insulative layer 114, conductive terminals 116, and conductive terminals 118 form a redistribution layer (RDL) 119. The RDL 119, combined with the semiconductor die 110, forms a wafer chip scale package (WCSP).

The semiconductor package 100 also includes one or more plated walls 122. The mold compound cavity 112 is formed when the one or more plated walls 122 prevents mold compound from flowing into an area within the one or more plated walls 122 during a mold compound application (e.g., injection) process. This results in the formation of the mold compound cavity 112, the boundaries of which may be defined by the one or more plated walls 122 on the sides, the insulative layer 114 and conductive terminals 118 on the bottom, and the horizontal plane formed by the top surface of the mold compound 106 on the top.

The one or more plated walls 122 have a horizontal thickness of at least 50 microns. A thickness below this range is insufficient to withstand the force of the mold compound flow and/or the weight of the mold compound and will buckle when mold compound is applied or after mold compound is applied. The one or more plated walls 122 have a height (or vertical length) ranging from 120 microns to 450 microns. A height below this range is disadvantageous because it limits wirebond looping heights which is a critical step to connect semiconductor dies to leads, while a height above this range is disadvantageous because it will result in an unacceptably large package. The top surfaces of the one or more plated walls 122 have a height that is at least 50 microns greater than the height of the solder members 120, with a lower height differential being disadvantageous because film (e.g., film 300, described below) used for the mold process will undesirably contact the tops of the solder members 120. In examples, the one or more plated walls 122 is formed of copper or another suitable metal or alloy. In examples, the one or more plated walls 122 is formed by a plating process, such as an electroplating process.

The one or more plated walls 122 is formed so that a maximum dimension of the mold compound cavity 112 is in the range from 100 microns to 420 microns. A maximum dimension that exceeds this range is disadvantageous because an unacceptably large package is produced, and a maximum dimension that is smaller than this range is disadvantageous because it limits wirebond loop height.

The one or more plated walls 122 have a horizontal clearance from each of the conductive terminals 118 that exceeds a maximum dimension of the solder members 120 by at least half of the solder member 120 pitch. A lesser clearance is unacceptable because a short circuit or other deleterious electrical consequences would result if a solder member 120 were to roll off of a respective conductive terminal 118 and establish electrical contact between that conductive terminal 118 and the one or more plated walls 122, or if a solder member 120 were to electrically couple the one or more plated walls 122 with another electrically conductive component of the semiconductor package 100 in some way. The conductive terminals 118 have the same minimum horizontal clearances from each other for the same reasons.

Bond wires 124 couple the conductive terminals 104 to conductive terminals 118 that are positioned outside the mold compound cavity 112. In examples, the conductive terminals 118 are plated with plated layers 126 (e.g., nickel plating) to prevent corrosion of the conductive terminals 118.

Figure 1B:
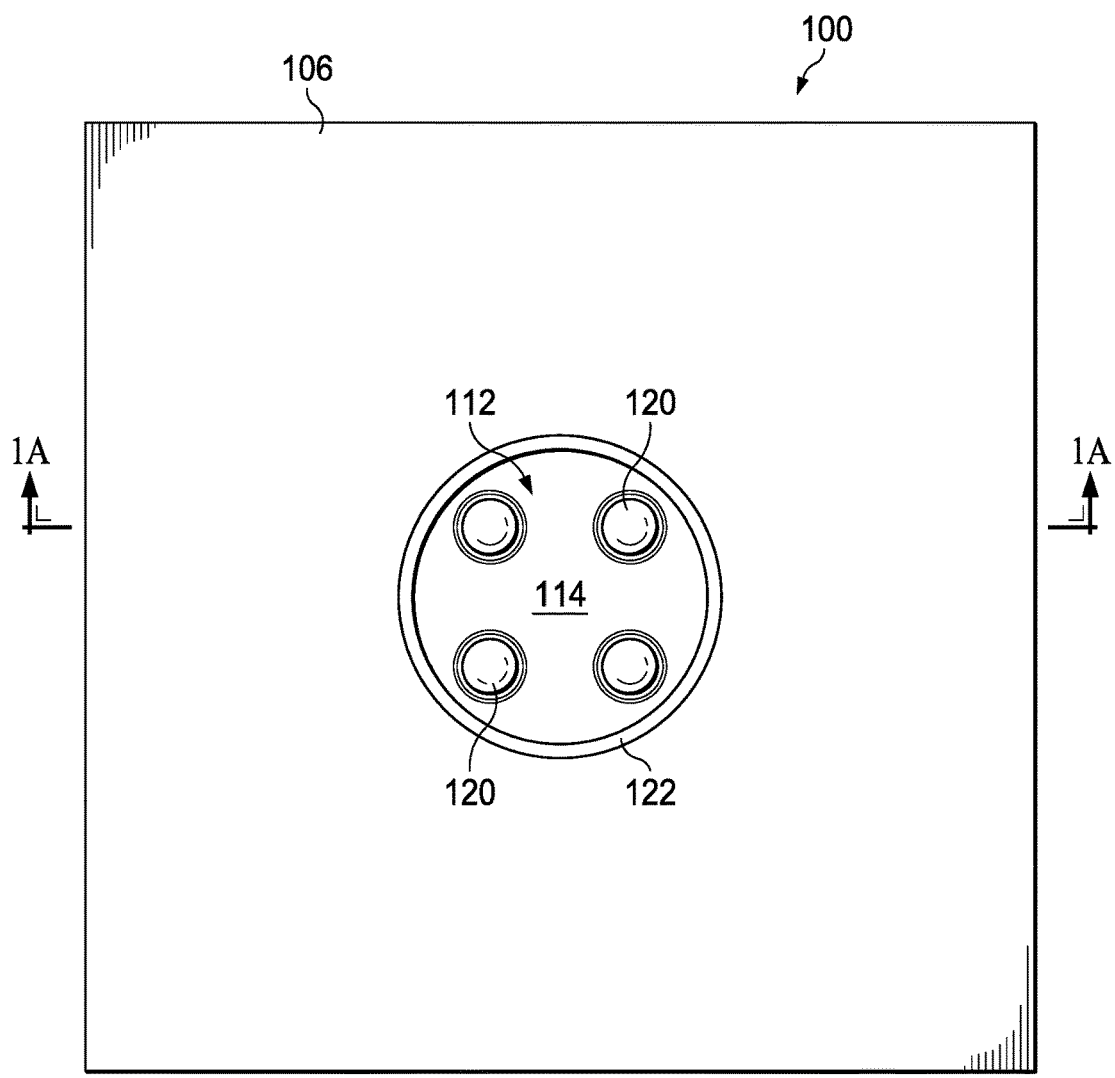
FIG. 1B is a top-down view of a semiconductor package having plated walls defining a mold compound cavity, in accordance with various examples.
Figure 1C:
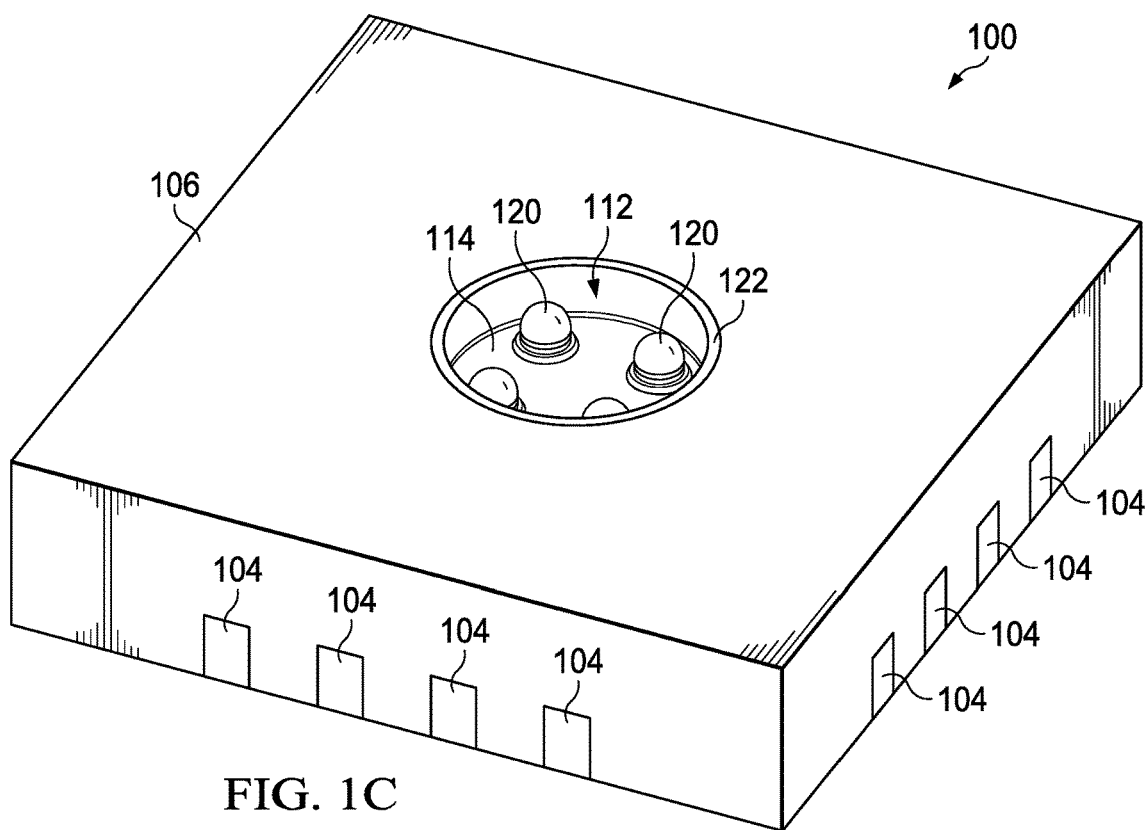
FIG. 1C is a perspective view of a semiconductor package having plated walls defining a mold compound cavity, in accordance with various examples.

FIG. 1B is a top-down view of the semiconductor package 100 in accordance with various examples. The one or more plated walls 122 may have a circular horizontal cross-section as shown in FIG. 1B. FIG. 1C is a perspective view of the example semiconductor package 100 shown in FIG. 1B.

Figure 1E:
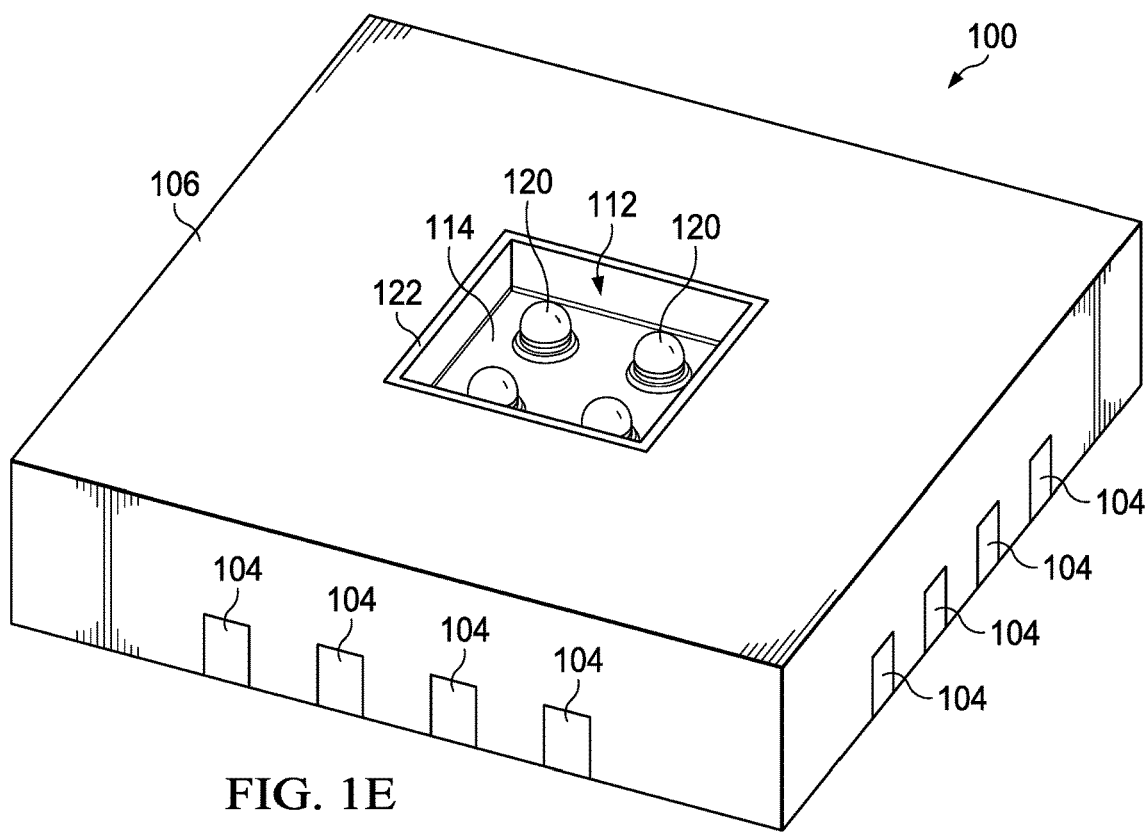
FIG. 1E is a perspective view of a semiconductor package having plated walls defining a mold compound cavity, in accordance with various examples.
Figure 1D:
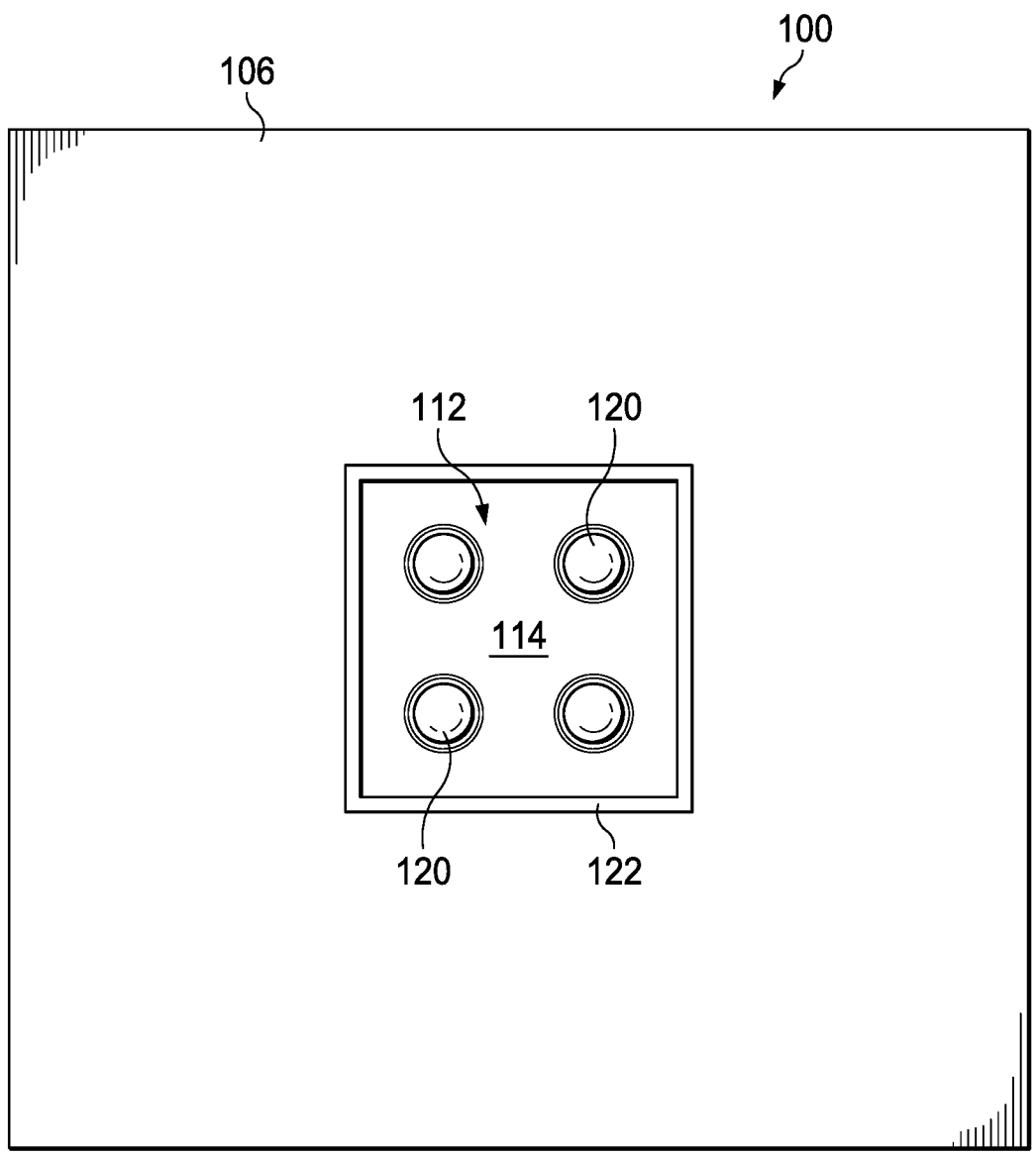
FIG. 1D is a top-down view of a semiconductor package having plated walls defining a mold compound cavity, in accordance with various examples.

FIG. 1D is a top-down view of the semiconductor package 100 in accordance with various examples. The one or more plated walls 122 may have a rectangular horizontal cross-section as shown in FIG. 1D. FIG. 1E is a perspective view of the example semiconductor package 100 shown in FIG. 1D.

Figure 4:
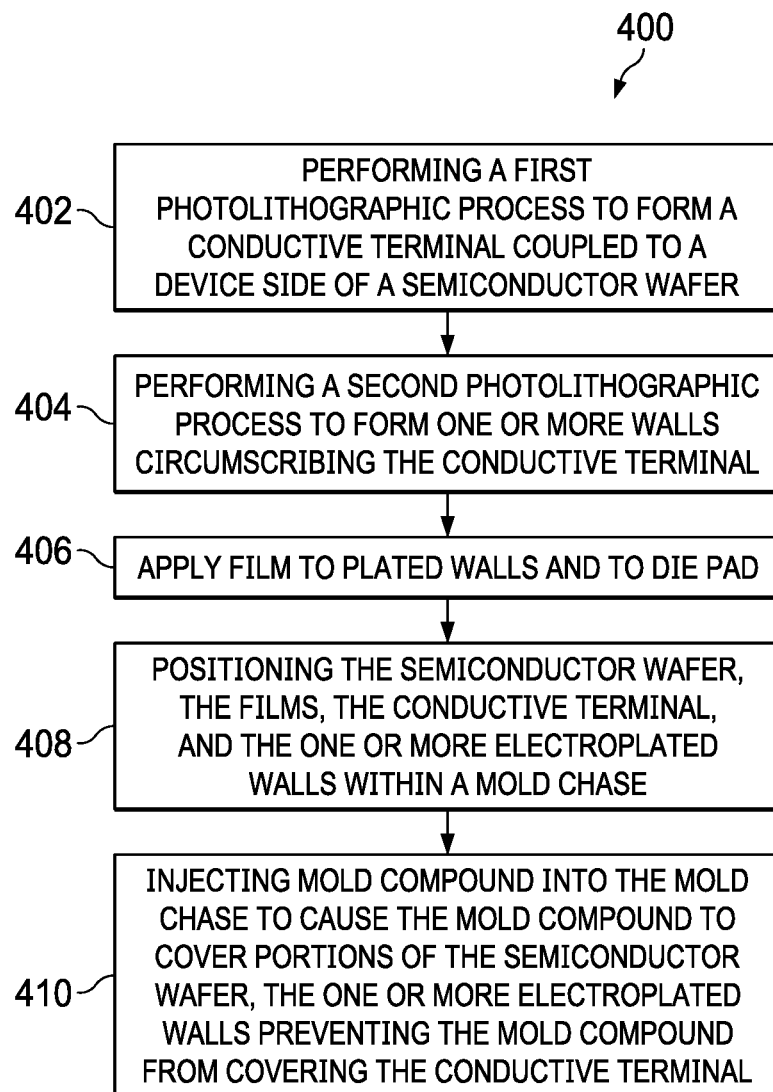
FIG. 4 is a flow diagram of a method for fabricating a semiconductor package having plated walls defining a mold compound cavity, in accordance with various examples.

FIGS. 2A1-2I2 are profile cross-sectional and top-down views of a process flow for fabricating a semiconductor package having plated walls, in accordance with various examples. FIGS. 3A1-3G6 are profile cross-sectional, top-down, and perspective views of a process flow for fabricating a semiconductor package having plated walls defining a mold compound cavity, in accordance with various examples. FIG. 4 is a flow diagram of a method 400 for fabricating a semiconductor package having plated walls defining a mold compound cavity, in accordance with various examples. Accordingly, the method 400 is now described in parallel with the process flows of FIGS. 2A1-2I2 and 3A1-3G6.

The method 400 begins with performing a first photolithographic process to form a conductive terminal coupled to a device side of a semiconductor wafer (402). FIG. 2A1 is a profile cross-sectional view of a semiconductor wafer 198 abutting the insulative layer 114 (e.g., polyimide) and the conductive terminal 116. The portion of the semiconductor wafer 198 visualized in FIG. 2A1 may, post-singulation, become part of the semiconductor die 110 shown in FIG. 1A. The device side of the semiconductor wafer 198 abuts the conductive terminal 116, and conductive traces or pads (not expressly shown) on the device side are coupled to the conductive terminal 116. A seed layer 200 is sputtered on the insulative layer 114 and the conductive terminal 116, as shown. FIG. 2A2 is a top-down view of the structure of FIG. 2A1.

FIG. 2B1 is a profile cross-sectional view of the structure of FIG. 2A1 with the addition of a photoresist layer 202 abutting the seed layer 200. The photoresist layer 202 is patterned as shown by the use of appropriate masks, light exposure, and developing solution, and includes an orifice 204. FIG. 2B2 is a top-down view of the structure of FIG. 2B1.

FIG. 2C1 is a profile cross-sectional view of the structure of FIG. 2B1 with the addition of the conductive terminal 118 abutting the portion of the seed layer 200 that abuts the conductive terminal 116. In examples, the conductive terminal 118 is formed by an electroplating technique on the portion of the seed layer 200 exposed by the orifice 204 (e.g., not covered by the photoresist layer 202). In examples, the conductive terminal 118 is composed of copper. FIG. 2C2 is a top-down view of the structure of FIG. 2C1.

FIG. 2D1 is a profile cross-sectional view of the structure of FIG. 2C1 with the removal of the photoresist layer 202. The photoresist layer 202 may be removed, for example, using a stripping technique. FIG. 2D2 is a top-down view of the structure of FIG. 2D1.

The method 400 includes performing a second photolithographic process to form (e.g., electroplate) one or more walls circumscribing the conductive terminal (404). FIG. 2E1 is a profile cross-sectional view of the structure of FIG. 2D1, but with the addition of a patterned photoresist 206 having an orifice 208. The size and shape of the orifice 208 are approximately the same as the size and shape, respectively, of the one or more plated walls 122 (FIG. 1A). The photoresist 206 may be patterned using appropriate masks, light exposure, and developing solution. FIG. 2E2 is a top-down view of the structure of FIG. 2E1.

FIG. 2F1 is a profile cross-sectional view of the structure of FIG. 2E1, but with the addition of the one or more plated walls 122, as shown. The one or more plated walls 122 may be formed, for example, through an electroplating process. The plating process is performed so as to achieve the locations, shapes, and dimensions of the one or more plated walls 122 described above. FIG. 2F2 is a top-down view of the structure of FIG. 2F1.

FIG. 2G1 is a profile cross-sectional view of the structure of FIG. 2F1, but with the removal of the photoresist 206 and the portions of the seed layer 200 that have not been electroplated. The photoresist 206 and appropriate portions of the seed layer 200 may be removed using a stripping technique. FIG. 2G2 is a top-down view of the structure of FIG. 2G1.

Although not expressly described in FIG. 4, the solder member 120 may be positioned on the conductive terminal 118, as shown in the profile cross-sectional views of FIGS. 2H1 and 2I1 and the top-down views of FIGS. 2H2 and 2I2.

FIGS. 2A1-2I2 depict the formation of a single conductive terminal 118 and the positioning of a single solder member 120 on the single conductive terminal 118 for simplicity and ease of explanation. In examples, any number of conductive terminals 118 may be formed and any number of solder members 120 may be positioned on the conductive terminals 118.

FIG. 3A1 is a profile cross-sectional view of the technique of FIGS. 2A1-2I2 having been applied to multiple conductive terminals 118 and to multiple solder members 120. FIG. 3A2 is a top-down view of the structure of FIG. 3A1. FIG. 3B1 is a profile cross-sectional view of the structure of FIG. 3A1 coupled to the die pad 102 using the die attach layer 108. FIG. 3B2 is a top-down view of the structure of FIG. 3B1. FIG. 3C1 is a profile cross-sectional view of the structure of FIG. 3B1, but with the addition of the bond wires 124 as shown. FIG. 3C2 is a top-down view of the structure of FIG. 3C1.

The method 400 includes applying a film (e.g., a film with a polyethylene terephthalate (PET) base and a flat or matte release layer) to top surfaces of the one or more plated walls 122 and to the bottom surface of the die pad 102 and the conductive terminals 104 (406). FIG. 3D1 is a profile cross-sectional view of the structure of FIG. 3C1 but with the addition of films 300 and 302. The film 300 abuts the distal ends of the one or more plated walls 122. The film 302 abuts the bottom surface of the die pad 102 and the conductive terminals 104. FIG. 3D2 is a top-down view of the structure of FIG. 3D1.

The method 400 includes positioning the semiconductor wafer, the conductive terminal, the films, and the one or more plated walls within a mold chase (408). FIG. 3D3 is a profile cross-sectional view of the structure of FIGS. 3D1 and 3D2 within a mold chase having a top chase member 304 and a bottom chase member 306. For example, the structure of FIG. 3D1 is positioned on the bottom chase member 306 and the top chase member 304 is lowered to contact the film 300. As shown, a thickness of the film 300 and a height of the one or more plated walls 122, when combined, are such that the film abuts the bottom surface of the top chase member 304. For this reason, the thickness of the film 300 does not exceed 80 microns and is not less than 30 microns.

The method 400 then includes injecting mold compound into the mold chase to cause the mold compound to cover portions of the semiconductor wafer, the one or more plated walls preventing the mold compound from covering the conductive terminals (410). The films are also removed. FIG. 3E is a profile cross-sectional view of the resulting structure. Because FIG. 3E is identical to FIG. 1A, FIGS. 1B and 1D are top-down views of the structure of FIG. 3E, and FIGS. 1C and 1E are perspective views of the structure of FIG. 3E. As shown in FIG. 3E, in examples, mold compound is completely absent from the cavity 112. In examples, mold compound is substantially absent from the cavity 112, except for trace amounts of residue that may inadvertently be deposited in the cavity 112. In some examples, as shown in FIG. 3G1 and described below, the cavity 112 may be filled or substantially filled with mold compound.

In examples, another semiconductor package, passive component (e.g., resistor, capacitor, inductor), or a combination thereof may be positioned within the mold compound cavity and coupled to the solder members within the mold compound cavity. FIG. 3F1 is a profile cross-sectional view of a semiconductor package 308 coupled to the solder members 120 within the mold compound cavity 112. FIG. 3F2 is a top-down view of the structure of FIG. 3F1 for the example in which the one or more plated walls 122 have a circular horizontal cross-section. FIG. 3F3 is a perspective view of the structure of FIG. 3F2. FIG. 3F4 is a top-down view of the structure of FIG. 3F1 for the example in which the one or more plated walls 122 have a rectangular horizontal cross-section. FIG. 3F5 is a perspective view of the structure of FIG. 3F4.

In some examples, a second mold compound may be applied to cover the semiconductor package or passive component in the mold compound cavity 112. FIG. 3G1 is a profile cross-sectional view of the structure of FIG. 3F1 but with the addition of a mold compound 310 to cover the semiconductor package 308 in the mold compound cavity 112. FIG. 3G2 is a top-down view of the structure of FIG. 3G1, and FIG. 3G3 is a perspective view of the structure of FIG. 3G1. In FIGS. 3G1-3G3, the mold compound 310 covers the semiconductor package 308 such that the semiconductor package 308 is not exposed to an environment of the semiconductor package 100. However, in some examples, a top surface of the semiconductor package 308 may be exposed to the environment external to the semiconductor package 100. For example, the top surface of the semiconductor package 308 may be flush or approximately flush with the top surface of the mold compound 310, as the profile cross-sectional, top-down, and perspective views of FIGS. 3G4, 3G5, and 3G6 show, respectively.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Unless otherwise stated, "about," "approximately," or "substantially" preceding a value means+/−10 percent of the stated value. Modifications are possible in the described examples, and other examples are possible within the scope of the claims.

What is claimed is:

1. A semiconductor package, comprising:
   a wafer chip scale package (WCSP) having a circuitry formed in a device side and an insulative layer above the device side;
   a wall extending vertically to form a defined space, the wall configured to prevent mold compound from flowing into the defined space;
   a mold compound abutting surfaces of the wall opposing the defined space; and
   a conductive terminal coupled to the circuitry and extending from the WCSP into the defined space.

2. The semiconductor package of claim 1, wherein the wall has a horizontal thickness of at least 50 microns.

3. The semiconductor package of claim 1, wherein the wall comprises copper.

4. The semiconductor package of claim 1, further comprising a second semiconductor package positioned in the defined space and coupled to the conductive terminal.

5. The semiconductor package of claim 1, further comprising a passive component positioned in the defined space and coupled to the conductive terminal.

6. The semiconductor package of claim 1, wherein a height of the wall ranges from 120 microns to 450 microns.

7. The semiconductor package of claim 1, further comprising a solder member coupled to the conductive terminal, a top surface of the wall having a greater height than the solder member.

8. The semiconductor package of claim 1, wherein the defined space is free of the mold compound.

9. A semiconductor package, comprising:
   a semiconductor die having a device side;
   an insulative layer above the semiconductor die;
   a conductive terminal extending from the device side and through the insulative layer;
   an electronic component coupled to the conductive terminal;
   a wall forming a defined space within which the electronic component is positioned, the defined space lacking a mold compound layer; and
   a mold compound abutting an outer surface of the wall opposing the defined space.

10. The semiconductor package of claim 9, wherein the wall comprises copper.

11. The semiconductor package of claim 9, further comprising a second semiconductor package in the defined space and coupled to the conductive terminal.

12. The semiconductor package of claim 9, wherein the wall has a horizontal thickness of at least 50 microns.

13. The semiconductor package of claim 9, wherein the wall has a distance from the conductive terminal of at least half of a pitch of the conductive terminal relative to other conductive terminals in the defined space plus a maximum dimension of the conductive terminal.

14. The semiconductor package of claim 9, wherein a top surface of the wall is higher than a solder member coupled to the conductive terminal.

15. The semiconductor package of claim 9, wherein the wall includes one of a circular and rectangular shapes from a top view of the semiconductor package.

* * * * *